US008704311B2

(12) United States Patent
Fujita et al.

(10) Patent No.: US 8,704,311 B2
(45) Date of Patent: Apr. 22, 2014

(54) SEMICONDUCTOR DEVICE HAVING EPITAXIAL SEMICONDUCTOR LAYER ABOVE IMPURITY LAYER

(75) Inventors: Kazushi Fujita, Yokohama (JP); Taiji Ema, Yokohama (JP); Hiroyuki Ogawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/343,078

(22) Filed: Jan. 4, 2012

(65) Prior Publication Data

US 2012/0223391 A1 Sep. 6, 2012

(30) Foreign Application Priority Data

Mar. 4, 2011 (JP) ................................ 2011-047764

(51) Int. Cl.

| | |
|---|---|
| ***H01L 23/62*** | (2006.01) |
| ***H01L 29/76*** | (2006.01) |
| ***H01L 29/94*** | (2006.01) |
| ***H01L 31/062*** | (2012.01) |
| ***H01L 31/113*** | (2006.01) |
| ***H01L 31/119*** | (2006.01) |

(52) U.S. Cl.
USPC .... 257/369; 257/357; 257/371; 257/E27.046; 257/E27.057; 257/E27.062; 257/E27.064; 257/E27.066; 257/E27.067; 257/E27.108

(58) Field of Classification Search
USPC .......... 257/357, 369, 371, E27.046, E27.057, 257/E27.062, E27.064, E27.065, E27.066, 257/E27.067, E27.108
See application file for complete search history.

(56) References Cited

U.S. PATENT DOCUMENTS

| | | | | |
|---|---|---|---|---|
| 5,479,033 | A * | 12/1995 | Baca et al. | 257/192 |
| 5,627,097 | A * | 5/1997 | Venkatesan et al. | 438/217 |
| 6,482,714 | B1 | 11/2002 | Hieda et al. | |
| 6,600,200 | B1 * | 7/2003 | Lustig et al. | 257/371 |
| 6,743,652 | B2 * | 6/2004 | Thomas et al. | 438/48 |
| 6,936,506 | B1 * | 8/2005 | Buller et al. | 438/197 |
| 7,449,389 | B2 * | 11/2008 | Meister et al. | 438/379 |
| 7,749,829 | B2 * | 7/2010 | Karve et al. | 438/198 |
| 7,781,840 | B2 * | 8/2010 | White et al. | 257/351 |
| 7,871,878 | B2 * | 1/2011 | Wang et al. | 438/199 |
| 7,888,747 | B2 * | 2/2011 | Hokazono | 257/392 |

(Continued)

OTHER PUBLICATIONS

Asenov, Asen "Suppression of Random Dopant-Induced Threshold Voltage Fluctuations in sub-0.1-um MOSFET's with Epitaxial and delta-doped Channels", IEEE Transactions on Electron Devices, vol. 46, No. 8, Aug. 1998, pp. 1718-1724.

(Continued)

*Primary Examiner* — Ida M Soward
(74) *Attorney, Agent, or Firm* — Fujitsu Patent Center

(57) ABSTRACT

The semiconductor device includes a first transistor including a first impurity layer of a first conductivity type formed in a first region of a semiconductor substrate, a first epitaxial semiconductor layer formed above the first impurity layer, a first gate insulating film formed above the first epitaxial semiconductor layer, and a first gate electrode formed above the first gate insulating film, and a second transistor including a second impurity layer of the second conductivity type formed in a second region of the semiconductor substrate, a second epitaxial semiconductor layer formed above the second impurity layer and having a thickness different from that of the first epitaxial semiconductor layer, a second gate insulating film formed above the second epitaxial semiconductor layer and having a film thickness equal to that of the first gate insulating film and a second gate electrode formed above the second gate insulating film.

15 Claims, 46 Drawing Sheets

(56) References Cited

U.S. PATENT DOCUMENTS

| | | | | |
|---|---|---|---|---|
| 7,893,502 | B2 * | 2/2011 | Li et al. | 257/369 |
| 7,915,686 | B2 * | 3/2011 | Shimamoto et al. | 257/369 |
| 8,114,739 | B2 * | 2/2012 | Chowdhury et al. | 438/258 |
| 8,395,216 | B2 * | 3/2013 | Owens | 257/350 |
| 2007/0178639 | A1 * | 8/2007 | Cecchi et al. | 438/227 |
| 2008/0265300 | A1 * | 10/2008 | Akiyama et al. | 257/311 |
| 2009/0108350 | A1 | 4/2009 | Cai et al. | |
| 2009/0206335 | A1 * | 8/2009 | Heinemann et al. | 257/51 |
| 2010/0032727 | A1 * | 2/2010 | Bu et al. | 257/255 |
| 2011/0108893 | A1 * | 5/2011 | Pinto et al. | 257/255 |
| 2011/0180881 | A1 * | 7/2011 | Pinto et al. | 257/371 |
| 2011/0248352 | A1 * | 10/2011 | Shifren et al. | 257/369 |
| 2012/0007145 | A1 * | 1/2012 | Chen et al. | 257/192 |

OTHER PUBLICATIONS

Hokazono, A. "Steep Channel Profiles in n/pMOS Controlled by Boron-Doped Si:C Layers for Continual Bulk-CMOS Scaling", IEDM09-673, 2009, pp. 29.1.1-29.1.4.

Lee, Woo-Hyeong "MOS Device Structure Development for ULSI: Low Power/High Speed Operation", Microelectron. Reliab., vol. 37, No. 9, Sep. 1997, pp. 1309-1314.

* cited by examiner

SEMICONDUCTOR DEVICE HAVING EPITAXIAL SEMICONDUCTOR LAYER ABOVE IMPURITY LAYER

CROSS REFERENCE TO RELATED APPLICATIONS

This application is based upon and claims the benefit of priority of the prior Japanese Patent Application No. 2011-047764, filed on Mar. 4, 2011, the entire contents of which are incorporated herein by reference.

FIELD

The embodiments discussed herein are related to a semiconductor device and a method of manufacturing a semiconductor device.

BACKGROUND

As semiconductor devices are downsized and highly integrated, the fluctuations of the threshold voltages of the transistors due to statistical fluctuations of the channel impurity becomes conspicuous. The threshold voltage is one of important parameters for deciding the performance of the transistors, and to manufacture semiconductor device of high performance and high reliability, it is important to decrease the fluctuations of the threshold voltage due to the statistical fluctuations of the impurity.

As one technique of decreasing the fluctuations of the threshold voltage due to the statistical fluctuations is proposed the technique that a non-doped epitaxial silicon layer is formed on a highly doped channel impurity layer having a steep impurity concentration distribution.

The following are examples of related: U.S. Pat. No. 6,482,714; U.S. Patent Publication No. 2009/0108350; A. Asenov, "Suppression of Random Dopant-Induced Threshold Voltage Fluctuations in Sub-0.1-μm MOSFET's with Epitaxial and δ-doped Channels", IEEE Transactions on Electron Devices, vol. 46, No. 8. p. 1718, 1999; Woo-Hyeong Lee, "MOS Device Structure Development for ULSI: Low Power/High Speed Operation", Microelectron. Reliab., Vol. 37, No. 9, pp. 1309-1314, 1997; and A. Hokazono et al., "Steep Channel Profiles in n/pMOS Controlled by Boron-Doped Si:C Layers for Continual Bulk-CMOS Scaling", IEDM09-673.

No method for incorporating the proposed techniques described above in the semiconductor device manufacturing processes have been specifically proposed. Especially, new problems which will take place by adopting the above-described techniques in manufacturing processes, and their solving means have not been specifically studied.

SUMMARY

According to one aspect of an embodiment, there is provided a semiconductor device including a first transistor including a first impurity layer of a first conductivity type formed in a first region of a semiconductor substrate, a first epitaxial semiconductor layer formed above the first impurity layer, a first gate insulating film formed above the first epitaxial semiconductor layer, a first gate electrode formed above the first gate insulating film, and first source/drain regions of a second conductivity type formed in the first epitaxial semiconductor layer and the semiconductor substrate in the first region, and a second transistor including a second impurity layer of the second conductivity type formed in a second region of the semiconductor substrate, a second epitaxial semiconductor layer formed above the second impurity layer and having a film thickness different from a film thickness of the first epitaxial semiconductor layer, a second gate insulating film formed above the second epitaxial semiconductor layer and having a film thickness equal to a film thickness of the first gate insulating film, a second gate electrode formed above the second gate insulating film, and second source/drain regions of the first conductivity type formed in the second epitaxial semiconductor layer and the semiconductor substrate in the second region.

According to another aspect of an embodiment, there is provided a method of manufacturing a semiconductor device including forming a first impurity layer of a first conductivity type in a first region of a semiconductor substrate, forming a second impurity layer of a second conductivity type in a second region of the semiconductor substrate, epitaxially growing a semiconductor layer above the semiconductor substrate with the first impurity layer and the second impurity layer formed in, forming above the semiconductor layer a mask covering the first region and exposing the second region, removing a part of the semiconductor layer by using the mask to thin a thickness of the semiconductor layer in the second region, removing the mask, forming a first gate insulating film above the semiconductor layer in the first region and a second gate insulating film of a film thickness equal to a film thickness of the first gate insulating film above the semiconductor layer in the second region, and forming a first gate electrode and a second gate electrode respectively above the first gate insulating film and above the second gate insulating film.

According to further another aspect of an embodiment, there is provided a method of manufacturing a semiconductor device including forming a first impurity layer of a first conductivity type in a first region of a semiconductor substrate, epitaxially growing a first semiconductor layer above the semiconductor substrate with the first impurity layer formed in, forming a second impurity layer of a second conductivity type in a second region of the semiconductor substrate with the first semiconductor layer formed on, epitaxially growing a second semiconductor layer above the semiconductor substrate with the first impurity layer, the second impurity layer and the first semiconductor layer formed, forming a first gate insulating film above the second semiconductor layer in the first region and forming a second gate insulating film of a film thickness equal to a film thickness of the first gate insulating film above the second semiconductor layer in the second region, and forming a first gate electrode and a second gate electrode respectively above the first gate insulating film and above the second gate insulating film.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

[A First Embodiment]

A semiconductor device and a method of manufacturing a semiconductor device according to a first embodiment will be described with reference to FIGS. 1 to 22.

Figure 1:
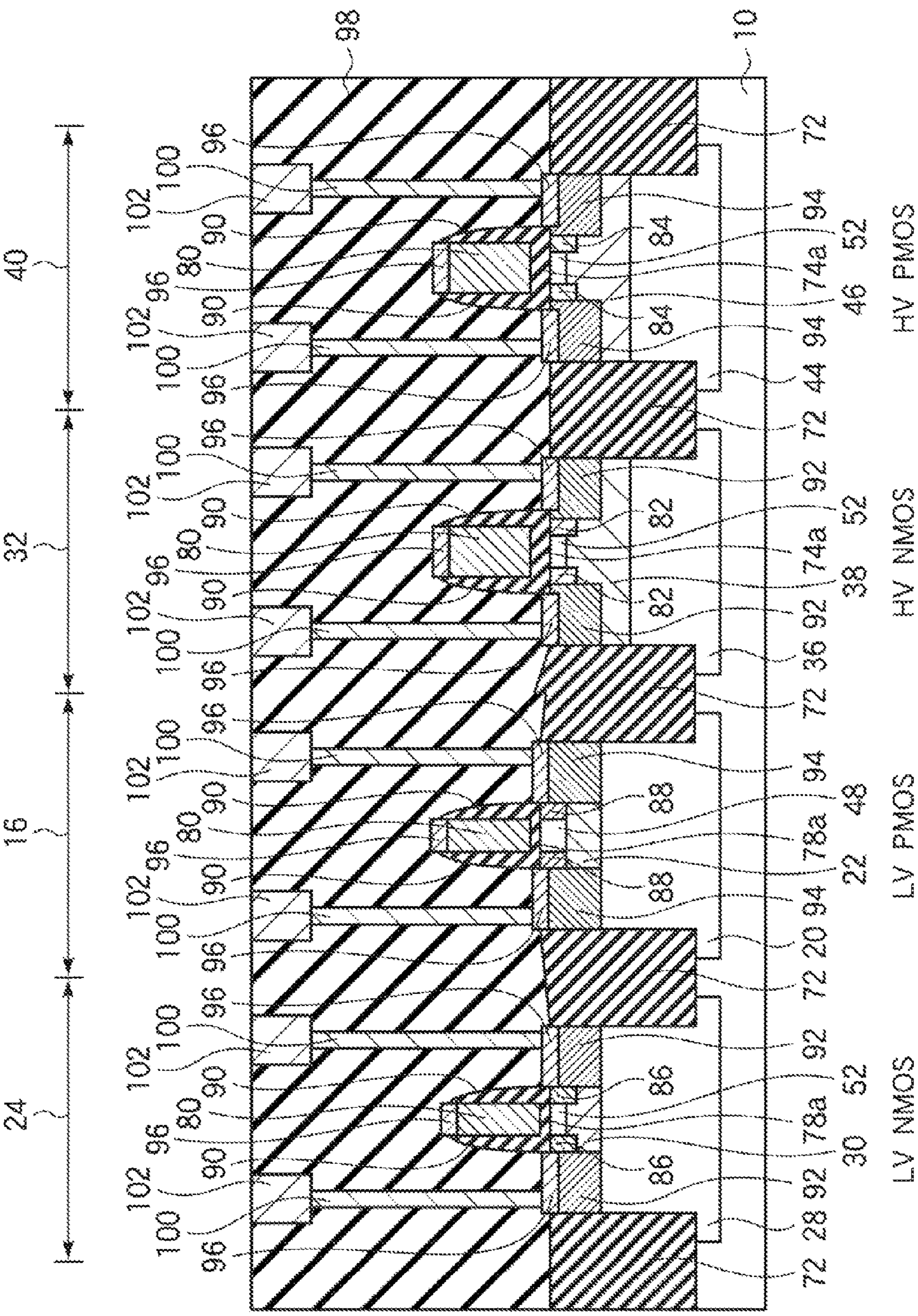
FIGS. 1 and 2 are diagrammatic sectional views illustrating a structure of a semiconductor device according to a first embodiment.
Figure 2:
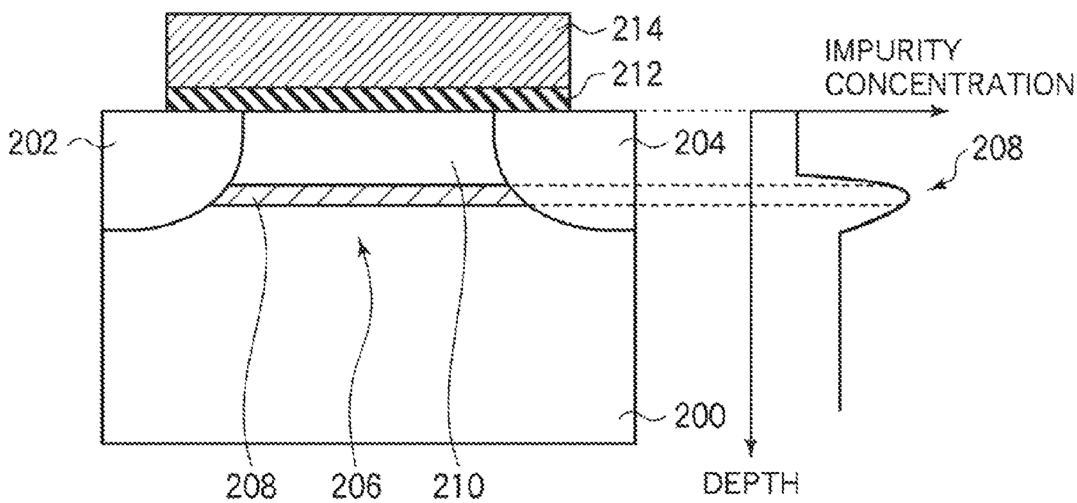

FIGS. 1 and 2 are diagrammatic sectional views illustrating a structure of a semiconductor device according to the present embodiment. FIGS. 3-21 are sectional views illustrating a method of manufacturing the semiconductor device according to the present embodiment. FIG. 22 is a graph illustrating relationships between the threshold voltage of the low voltage transistor and the deposited film thickness of the epitaxial silicon layer.

First, the structure of the semiconductor device according to the present embodiment will be described with reference to FIGS. 1 and 2.

A low voltage NMOS transistor forming region 24, a low voltage PMOS transistor forming region 16, a high voltage NMOS transistor forming region 32 and a high voltage PMOS transistor forming region 40 are provided on a silicon substrate 10. In the respective transistor forming region, active regions are defined by a device isolation insulating film 72.

An n-well 20 and an n-type highly doped impurity layer 22 are formed in the silicon substrate 10 in the low voltage PMOS transistor forming region 16. A silicon layer 48 epitaxially grown on the silicon substrate 10 is formed above the n-type highly doped impurity layer 22. A gate insulating film 78*a* is formed above the silicon layer 48. A gate electrode 80 is formed above the gate insulating film 78*a*. Source/drain regions 94 are formed in the silicon layer 48 and the silicon substrate 10 on both sides of the gate electrode 80. Thus, a low voltage PMOS transistor (LV PMOS) is formed.

A p-well 28 and a p-type highly doped impurity layer 30 are formed in the silicon substrate 10 in the low voltage NMOS transistor forming region 24. A silicon layer 52 epitaxially grown on the silicon substrate 10 and being thinner than the silicon layer 48 is formed above the p-type highly doped impurity layer 30. A gate insulating film 78*a* is formed above the silicon layer 52. A gate electrode 80 is formed above the gate insulating film 78*a*. Source/drain regions 92 are formed in the silicon layer 52 and the silicon substrate 10 on both sides of the gate electrode 80. Thus, a low voltage NMOS transistor (LV NMOS) is formed.

The low voltage PMOS transistor and the low voltage NMOS transistor are used mainly in circuits which require high speed operation.

A p-well 36 and a p-type impurity layer 38 are formed in the silicon substrate 10 in the high voltage NMOS transistor forming region 32. The p-type impurity layer 38 has lower concentration and more gradual impurity distribution than the p-type highly doped impurity layer 30 of the low voltage NMOS transistor for the higher junction breakdown voltage and the hot carrier immunity. A silicon layer 52 epitaxially grown on the silicon substrate 10 is formed above the p-type impurity layer 38. A gate insulating film 74*a* thicker than the gate insulating films 78*a* of the low voltage transistors is formed above the silicon layer 52. A gate electrode 80 is formed above the gate insulating film 74*a*. Source/drain regions 92 are formed in the silicon layer 52 and the silicon substrate 10 on both sides of the gate electrode 80. Thus, a high voltage NMOS transistor (HV NMOS) is formed.

An n-well 44 and an n-type impurity layer 46 are formed in the silicon substrate 10 in the high voltage PMOS transistor forming region 40. The n-type impurity layer 46 has lower concentration and more gradual impurity distribution than the n-type highly doped impurity layer 22 of the low voltage PMOS transistor for the higher junction breakdown voltage and the hot carrier immunity. A silicon layer 52 epitaxially grown on the silicon substrate 10 is formed above the n-type impurity layer 46. A gate insulating film 74*a* thicker than the gate insulating films 78*a* of the low voltage transistors is formed above the silicon layer 52. A gate electrode 80 is formed above the gate insulating film 74*a*. Source/drain regions 94 are formed in the silicon layer 52 and the silicon substrate 10 on both sides of the gate electrode 80. Thus, a high voltage PMOS transistor (HV PMOS) is formed.

The high voltage NMOS transistor and the high voltage PMOS transistor are used in a circuit unit, e.g., 3.3V I/O, which high voltage is applied to.

A metal silicide film 96 is formed above the gate electrode 80 and the source/drain regions 92, 94 of each transistor.

An inter-layer insulating film 98 is formed above the silicon substrate 10 with the 4 kinds of transistors formed on. Contact plugs 100 connected to the transistors are buried in the inter-layer insulating film 98. Interconnections 102 are connected to the contact plugs 100.

As described above, the semiconductor device according to the present embodiment includes 2 kinds of the low voltage transistors of the PMOS transistor and the low voltage NMOS transistor, and 2 kinds of high voltage transistors of the high voltage NMOS transistor and the high voltage PMOS transistor.

As exemplified in FIG. 2, the low voltage transistors include in a channel region 206 a highly doped impurity layer 208 having a steep impurity concentration distribution and a non-doped silicon layer 210 epitaxially grown above the highly doped impurity layer 208. The highly doped impurity layer 208 and the silicon layer 210 illustrated in FIG. 2 correspond respectively to the n-type doped impurity layer 22 and the silicon layer 48 of the low voltage PMOS transistor and to the p-type highly doped impurity layer 30 and the silicon layer 52 of the low voltage NMOS transistor. The transistor structure including the non-doped epitaxial layer on the highly doped impurity layer is effective to suppress the fluctuations of the threshold voltage of the transistor due to statistical fluctuations of the impurity.

The highly doped impurity layer 208 is different between the NMOS transistor and the PMOS transistor in the impurity forming the highly doped impurity layer 208. For example, in a reference example to be described later, the diffusion of the arsenic forming the highly doped impurity layer of the PMOS transistor into the silicon layer 210 is faster than the boron forming the highly doped impurity layer 208 of the NMOS transistor into the silicon layer 210. That is, in the PMOS transistor, the highly doped impurity layer 208 is distributed nearer to the silicon layer 210 in comparison with the NMOS transistor (see FIG. 46).

The threshold voltage of the transistor including the non-doped silicon layer 210 above the highly doped impurity layer 208 depends on the impurity concentration of the highly doped impurity layer 208 and the film thickness of the non-doped region of the silicon layer 210 (the distance between the gate insulating film 212 and the highly doped impurity layer 208). Accordingly, the NMOS transistor and the PMOS transistor have different impurity diffusion velocities, whereby the optimum film thickness of the silicon layers 210 for obtaining target threshold voltage is often different. Resultantly, when, as in the reference example to be described later, the epitaxial silicon layers of the NMOS transistor and the PMOS transistor have the same film thickness, it is difficult to realize an optimum impurity profile both in the NMOS transistor and in the PMOS transistor.

In the semiconductor device according to the present embodiment, however, taking into consideration the difference of the diffusion velocity between the n-type impurity and the p-type impurity, the film thickness of the silicon layer 48 formed in the PMOS transistor forming region and the film thickness of the silicon layer 52 of the NMOS transistor forming region are different. Specifically, in the case that the diffusion is higher than the diffusion of the impurity forming the n-type highly doped impurity layer 22 toward the epitaxial layer, considering, for example, that the impurity forming the n-type highly doped impurity layer 22 is As, and the impurity forming the p-type highly doped impurity layer 30 is B/C, the film thickness of the silicon layer 48 is made larger than the film thickness of the silicon layer 52. Thus, both in the NMOS transistor and the PMOS transistor, the film thickness of the epitaxial layers can be made optimum to obtain target threshold voltages.

In the case that the diffusion of the impurity forming the p-type highly doped impurity layer 30 toward the epitaxial layer is higher than the diffusion of the impurity forming the n-type highly doped impurity layer 22 toward the epitaxial layer, when, for example, the impurity forming the p-type highly doped impurity layer 30 is B/C, and the impurity forming the n-type highly doped impurity layer 22 is Sb, the relationship of the film thickness of the silicon layers between the NMOS and the PMOS may be reversed. In the present embodiment, the film thickness of the silicon layer 52 of the high voltage transistor forming region is equal to the film thickness of the silicon layer 52 of the low voltage NMOS transistor but may be equal to the film thickness of the silicon layer 48 of the low voltage PMOS transistor. The film thickness of the high voltage transistor forming region may be different from the film thickness of the silicon layer 52 of the low voltage NMOS transistor and the film thickness of the silicon layer 48 of the low voltage PMOS transistor.

The film thickness of the epitaxial silicon layer formed in the respective transistor regions can be changed suitably in accordance with characteristics required of the respective transistors.

Next, the method of manufacturing the semiconductor device according to the present embodiment will be described with reference to FIGS. 3 to 21.

First, by photolithography and etching, a trench 12 to be used as the mark for the mask alignment is formed in a region other than the product to be formed region of the silicon substrate 10 (e.g., a scribe region).

In the method of manufacturing the semiconductor device according to the present embodiment, before device isolation insulating film 72 is formed, the wells and the channel impurity layers are formed. The trench 12 is used as the mark for the mask alignment in the lithography process made before the device isolation insulating film 72 is formed (e.g., the lithography process for forming the wells and the channel impurity layers).

Figure 3:
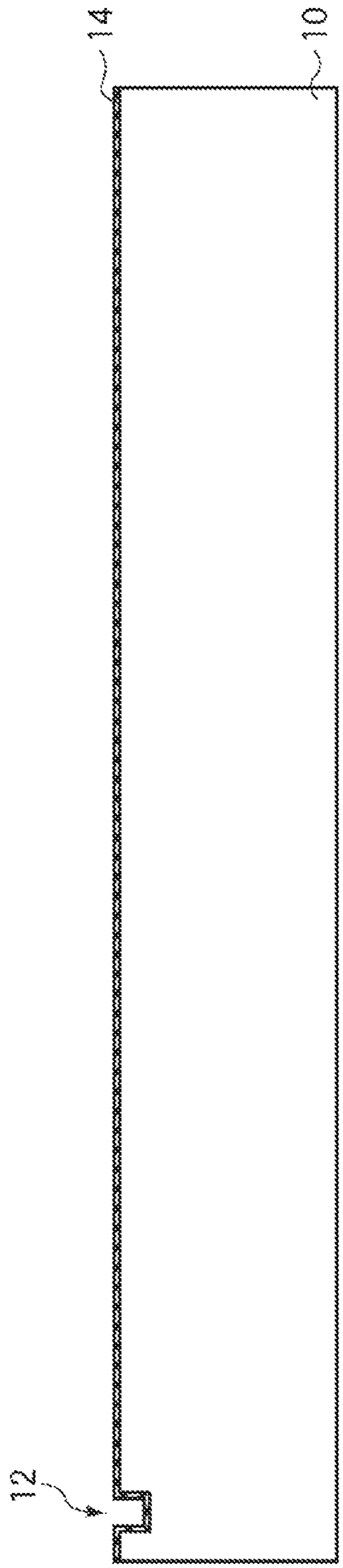
FIGS. 3-21 are sectional views illustrating a method of manufacturing the semiconductor device according to the first embodiment.

Next, above the entire surface of the silicon substrate 10, a silicon oxide film 14 as the protection film of the surface of the silicon substrate 10 is formed by, e.g., thermal oxidation method (FIG. 3).

Next, by photolithography, a photoresist film 18 exposing the low voltage PMOS transistor forming region 16 and covering the rest region is formed. For the alignment for the photolithography, the trench 12 is used as the alignment mark.

Figure 4:
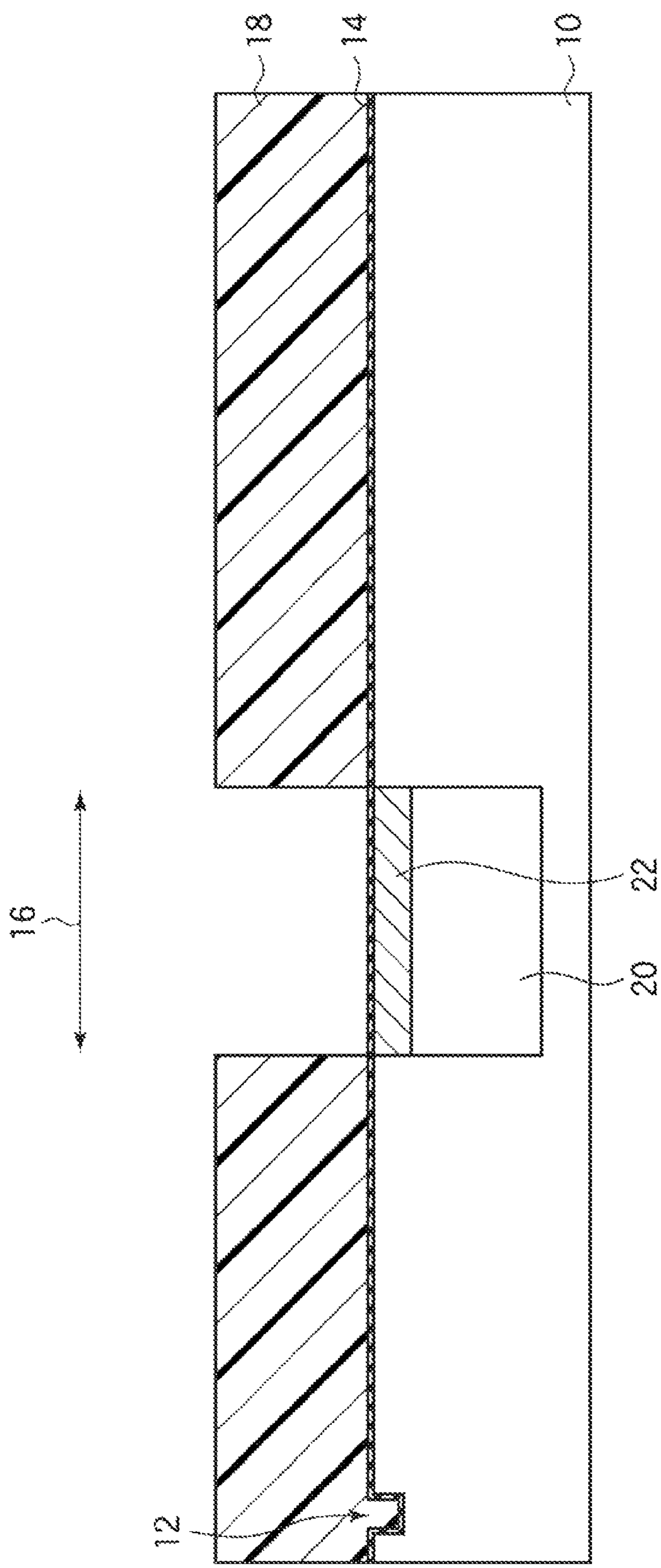

Next, ion implantation is made with the photoresist film 18 as the mask to form an n-well 20 and an n-type highly doped impurity layer 22 in the low voltage PMOS transistor forming region 16 (FIG. 4).

The n-well 20 is formed, e.g., by implanting respectively in 4 directions tilted to the normal direction of the substrate phosphorus ions ($P^+$) under the conditions of 360 keV acceleration energy and $7.5\times10^{12}$ $cm^{-2}$ dose. The n-type highly doped impurity layer 22 is formed, e.g., by implanting arsenic ions ($As^+$) under the conditions of 6 keV acceleration energy and $2\times10^{13}$ $cm^{-2}$ dose. In place of arsenic ions, antimony ($Sb^+$) are ion implanted under the conditions of, e.g., 20 keV acceleration energy and $1\times10^{13}$ $cm^{-2}$ dose.

Next, by, e.g., asking method, the photoresist film 26 is removed.

Next, by photolithography, a photoresist film 26 exposing the low voltage NMOS transistor forming region 24 and covering the rest region is formed. For the alignment for the photolithography, the trench 12 is used as the alignment mark.

Figure 5:
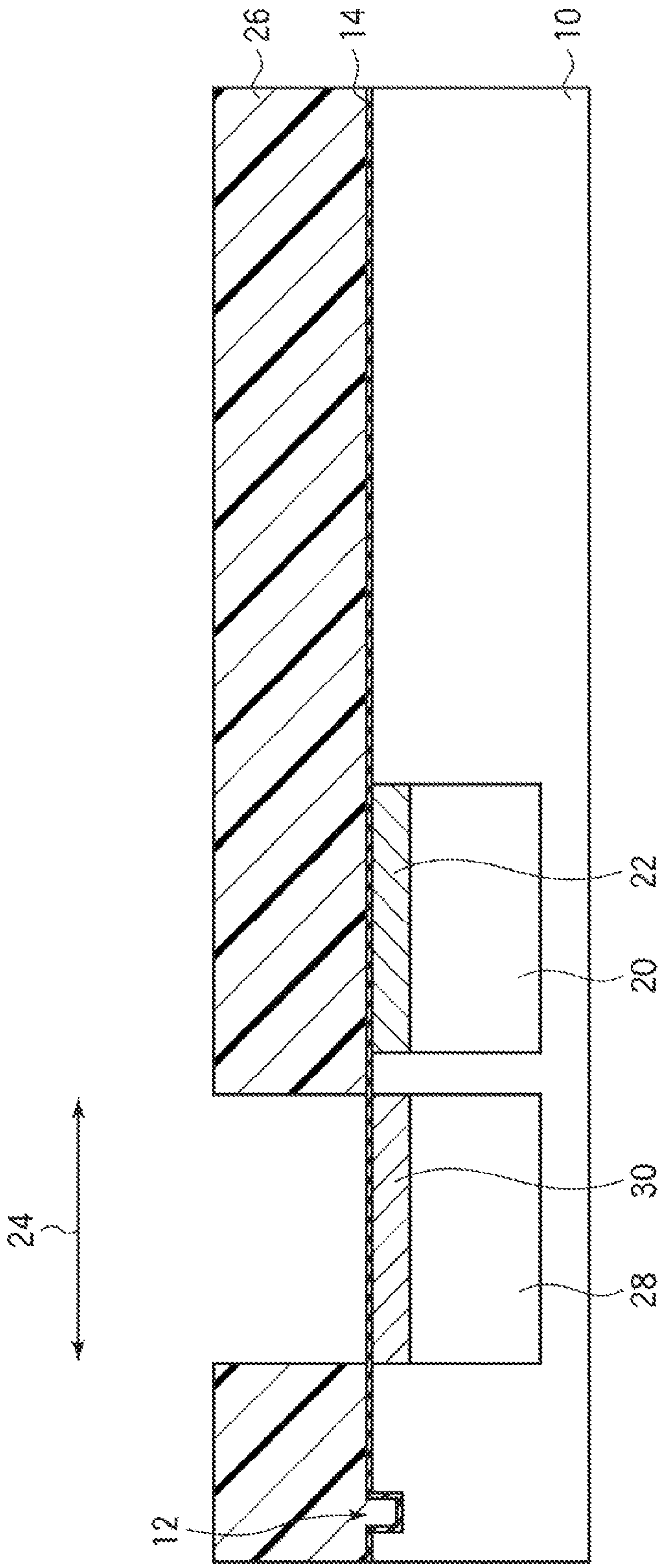

Next, ion implantation is made with the photoresist film 26 as the mask to form a p-well 28 and a p-type highly doped impurity layer 30 in the low voltage NMOS transistor forming region 24 (FIG. 5).

The p-well 28 is formed, e.g., by implanting boron ions ($B^+$) respectively in 4 directions tilted to the normal direction of the substrate under the conditions of 150 keV acceleration energy and $7.5\times10^{12}$ $cm^{-2}$ dose. The p-type highly doped impurity layer 30 is formed, e.g., by respectively implanting germanium ions ($Ge^+$) under the conditions of 50 keV acceleration energy and $5\times10^{14}$ $cm^{-2}$, carbon ions ($C^+$) under the conditions of 3 keV acceleration energy and $3\times10^{14}$ $cm^{-2}$ and boron ions ($B^+$) under the conditions of 2 keV acceleration energy and $3\times10^{13}$ $cm^2$. Germanium acts to amorphize the silicon substrate 10 to thereby prevent the channeling of the boron ions and amorphize the silicon substrate 10 to increase the probability of positioning the carbon at the lattice points. The carbon positioned at the lattice points acts to suppress the diffusion of boron. In view of this, germanium is ion implanted before carbon and boron. It is preferable that the p-well 28 is formed before the p-type highly doped impurity layers 30.

Next, by, e.g., ashing method, the photoresist film 26 is removed.

Then, by photolithography, a photoresist film 34 exposing the high voltage NMOS transistor forming region 32 and covering the rest region is formed. For the alignment for the photolithography, the trench 12 is used as the alignment mark.

Figure 6:
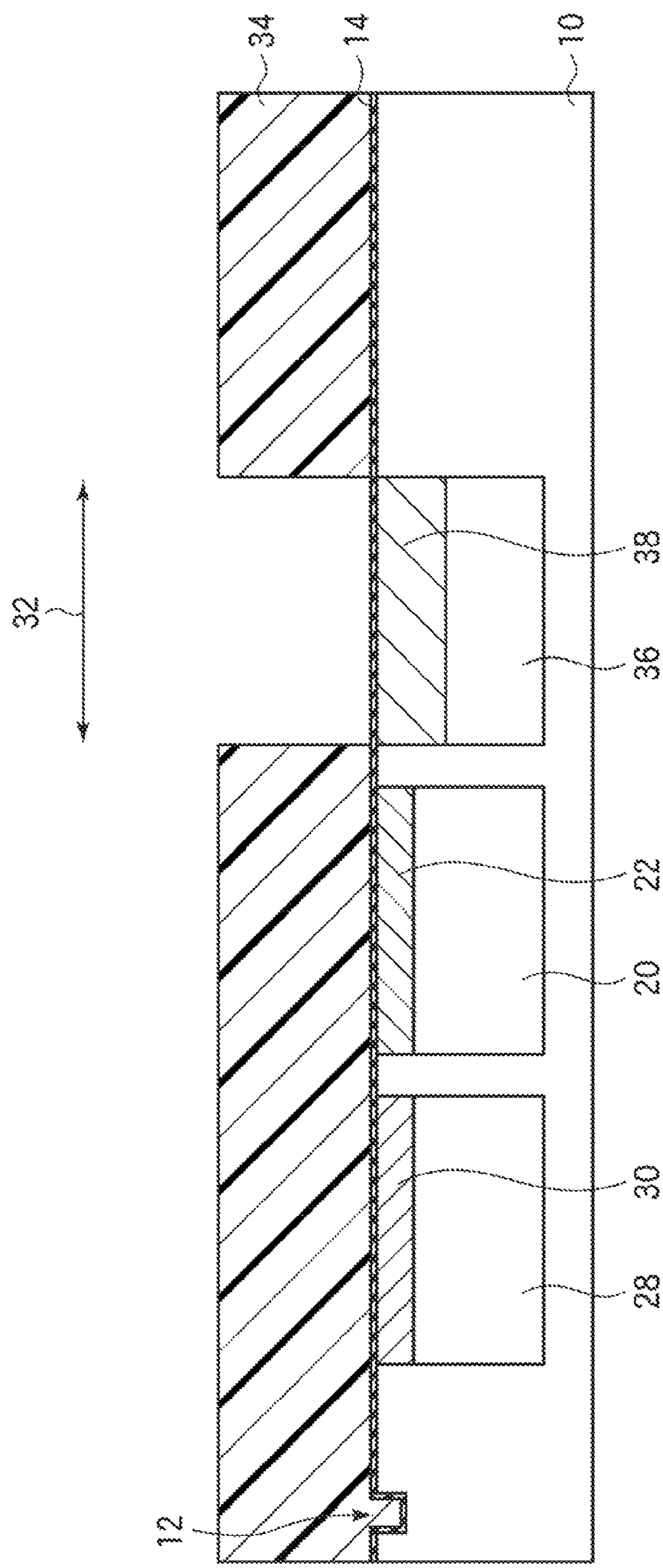

Next, with the photoresist film 34 as the mask, ion implantation is made to form a p-well 36 and a p-type impurity layer 38 in the high voltage NMOS transistor forming region 32 of the silicon substrate 10 (FIG. 6).

The p-well 36 is formed, e.g., by implanting respectively in 4 directions tilted to the normal direction of the substrate boron ions under the conditions of 150 keV acceleration energy and $7.5\times10^{12}$ $cm^{-2}$ dose. The p-type impurity layer 38 is formed, e.g., by implanting boron ions under the conditions of 2 keV acceleration energy and $5\times10^{12}$ $cm^{-2}$ dose. In the high voltage NMOS transistor, in view of making the impurity concentration distribution of the channel region gradual to thereby improve the junction breakdown voltage and the hot carrier immunity, neither carbon nor germanium is ion implanted.

Next, by, e.g., ashing method, the photoresist film 34 is removed.

Next, by photolithography, a photoresist film 42 exposing the high voltage PMOS transistor forming region 40 and covering the reset region is formed. For the alignment for the photolithography, the trench 12 is used as the alignment mark.

Figure 7:
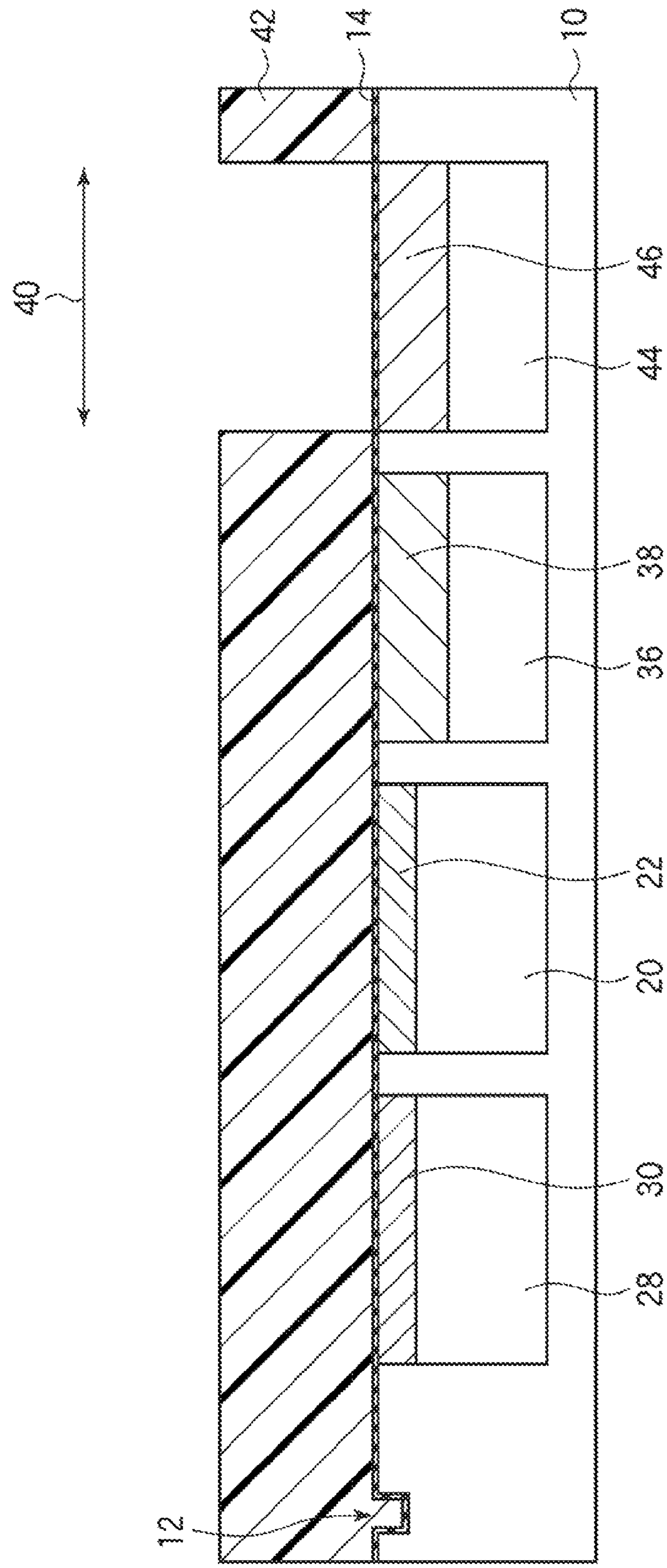

Next, with the photoresist film 42 as the mask, ion implantation is made to form an n-well 44 and an n-type impurity layer 46 in the high voltage PMOS transistor forming region 40 of the silicon substrate 10 (FIG. 7).

The n-well 44 is formed, e.g., by implanting respectively in 4 directions tilted to the normal direction of the substrate phosphorus ions at 360 keV acceleration energy and $7.5\times10^{12}$ $cm^{-2}$ dose. The n-type impurity layer 46 is formed, e.g., by implanting phosphorus ions at 2 keV acceleration energy and $5\times10^{12}$ $cm^{-2}$ dose. In the high voltage PMOS transistor, in view of making the impurity concentration distribution of the channel region gradual to thereby improve the junction breakdown voltage and hot carrier immunity, phosphorus in place of arsenic or antimony is ion implanted.

Next, by, e.g., asking method, the photoresist film 42 is removed.

The ion-implantation made in the respective transistor forming regions may be made first into any one of the regions.

Next, thermal processing is made in an inert ambient atmosphere to recover ion implantation damages introduced in the silicon substrate 10 while activating the implanted impurities. For example, the thermal processing is made in nitrogen ambient atmosphere on two stages of 600° C. and 150 seconds and 1000° C. and 0 second.

At this time, the p-type highly doped impurity layer 30, in which germanium and carbon together with boron are implanted, can more suppress the diffusion of the boron in comparison with the p-type impurity layer 38, in which boron alone is implanted. Thus, a steep distribution of the p-type highly doped impurity layer 30 is sustained while the impurity of the p-type impurity layer 38 can be distributed broad.

The n-type highly doped impurity layer 22 is formed with arsenic or antimony, whose diffusion coefficient is smaller than phosphorus, with which the n-type impurity layer 46 is formed, whereby a steep distribution of the n-type highly doped impurity layer 22 is sustained while the impurity of the n-type impurity layer 46 can be distributed broad.

Then, by wet etching with, e.g., hydrofluoric acid aqueous solution, the silicon oxide film 14 is removed.

Figure 8:
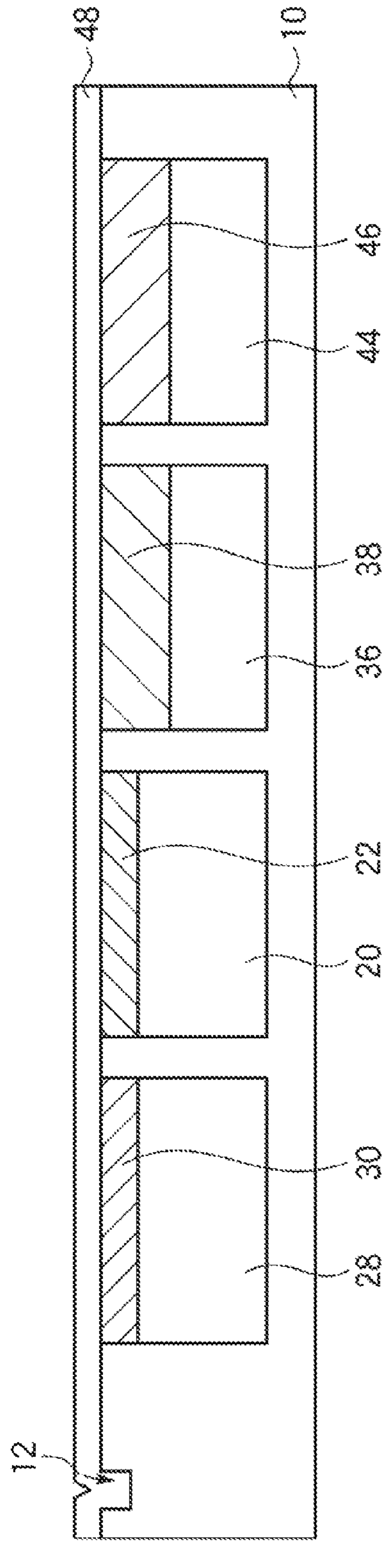

Next, by, e.g., CVD method, a non-doped silicon layer 48 of, e.g., a 34 nm-thickness is grown on the surface of the silicon substrate 10 (FIG. 8).

Next, by photolithography, a photoresist film 50 exposing the low voltage NMOS transistor forming region 24 and the high voltage transistor forming regions 32, 40 and covering the rest region is formed. For the alignment for the photolithography, the trench 12 is used as the alignment mark. In the case that antimony is used in place of arsenic, the photoresist film 50 exposing the low voltage PMOS transistor forming region 16 and the high voltage transistor forming regions 32, 40 and covering the rest region is formed. In the following description, the case where arsenic is used will be described.

Figure 9:
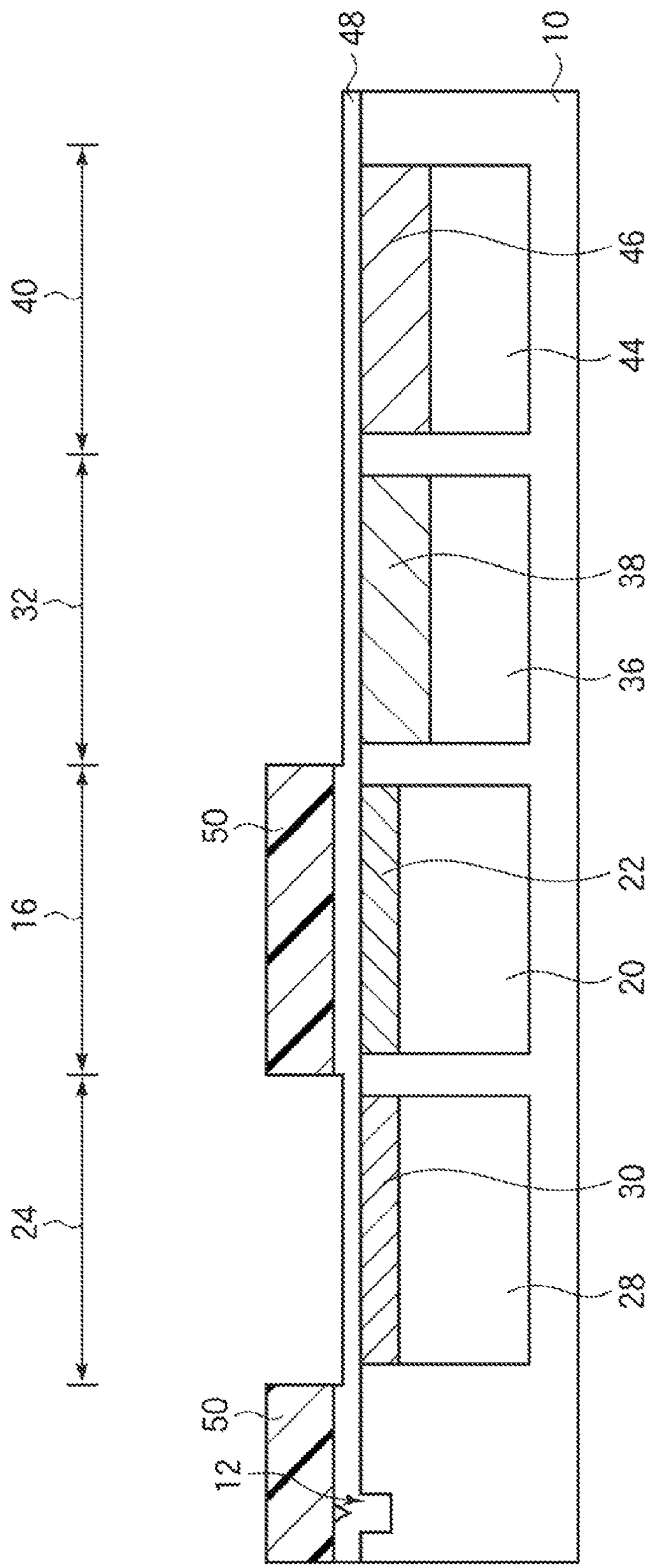

Then, with the photoresist film 50 as the mask, the silicon layer 48 in the region which is not covered by the photoresist film 50 is etched by about 8 nm by wet etching with, e.g., TMAH or mixture aqueous solution of hydrofluoric acid and nitric acid ($HF/HNO_3/H_2O$) (FIG. 9).

Next, by, e.g., asking method, the photoresist film 50 is removed.

Figure 10:
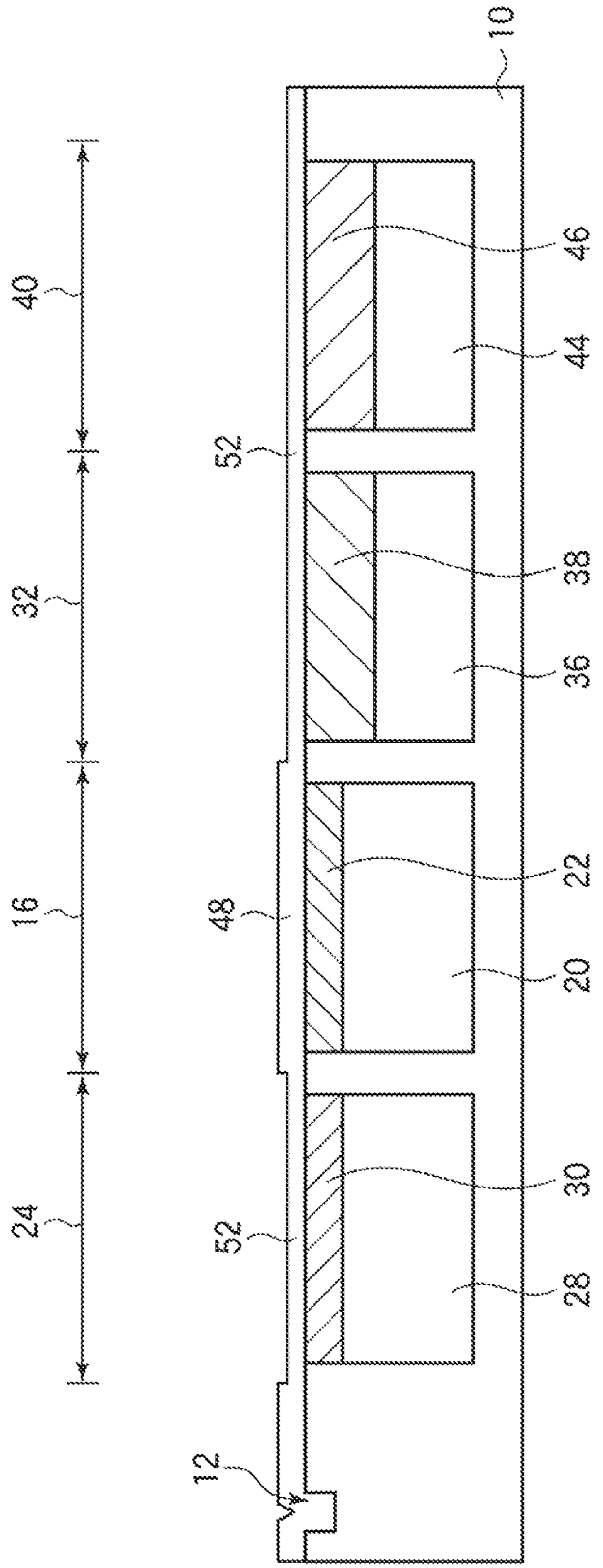

Thus, the silicon layer 40 of a 34 nm-thickness is formed in the low voltage PMOS transistor forming region 16, and the silicon layers 52 of a 26 nm-thickness is formed in the low voltage NMOS transistor forming region 24 and the high voltage transistor forming regions 32, 40 (FIG. 10).

As described above, the diffusion of arsenic forming the n-type highly doped impurity layer 22 toward the silicon layer 48 is larger by about 10 nm than the diffusion of boron forming the p-type highly doped impurity layer 30 toward the silicon layer 52. The optimum deposited film thickness of the silicon layers to obtain target threshold voltages differs between the low voltage PMOS transistor and the low voltage NMOS transistor.

FIG. 22 is a graph of one example of the relationships between the threshold voltage of the low voltage transistor and the deposited film thickness of the epitaxial silicon layer. On the vertical axis, the absolute value of the threshold voltage is taken, and deposited film thickness of the silicon layer is taken on the horizontal axis. In the graph, the plots of the ■ mark are for the PMOS, and the plots of the ♦ mark are for the NMOS.

As shown in FIG. 22, the absolute value of the threshold voltage tends to lower as the deposited film thickness of the silicon layer is increased. Here, it is assumed that the target threshold voltage of the low voltage NMOS transistor is 0.30 V (the one-dot chain line in the graph), the optimum deposited film thickness of the silicon layer of the low voltage NMOS transistor is about 26 nm. On the other hand, it is assumed that the target threshold voltage of the low voltage PMOS transistor is −0.33 V (the one-dot chain line in the graph), the optimum deposited film thickness of the silicon layer of the low voltage PMOS transistor is about 34 nm.

Accordingly, in the example shown in FIG. 22, the film thickness of the silicon layer 48 is set at about 34 nm, and the film thickness of the silicon layer 52 is set at about 26 nm, whereby the target threshold voltage can be obtained in both the low voltage NMOS transistor and the low voltage PMOS transistor.

The silicon layers 48, 52 can be formed in different film thicknesses by the simple process with one lithography step and one etching step added to, which never much increases the manufacturing cost.

Preferably, the film thicknesses of the silicon layer 48 and the silicon layer 52 are set suitably corresponding to the diffusion velocity of the impurity forming the n-type highly doped impurity layer 22, the diffusion velocity of the impurity forming the p-type highly doped impurity layer 30, an optimum film thickness of the non-doped regions to obtain target threshold voltages, etc.

Next, by, e.g., ISSG (In-Situ Steam Generation) method, the surface of the silicon layer 48 is wet oxidized under a reduced pressure to form a silicon oxide film 66 of, e.g., a 3 nm-thickness. As the processing conditions, for example, the temperature is set at 810° C., and the processing period of time is set at 20 seconds.

Then, above the silicon oxide film 66, a silicon nitride film 68 of, e.g., a 90 nm-thickness is deposited by, e.g., LPCVD method. As the processing conditions, for example, the temperature is set at 700° C., and the processing period of time is set at 150 minutes.

Figure 11:
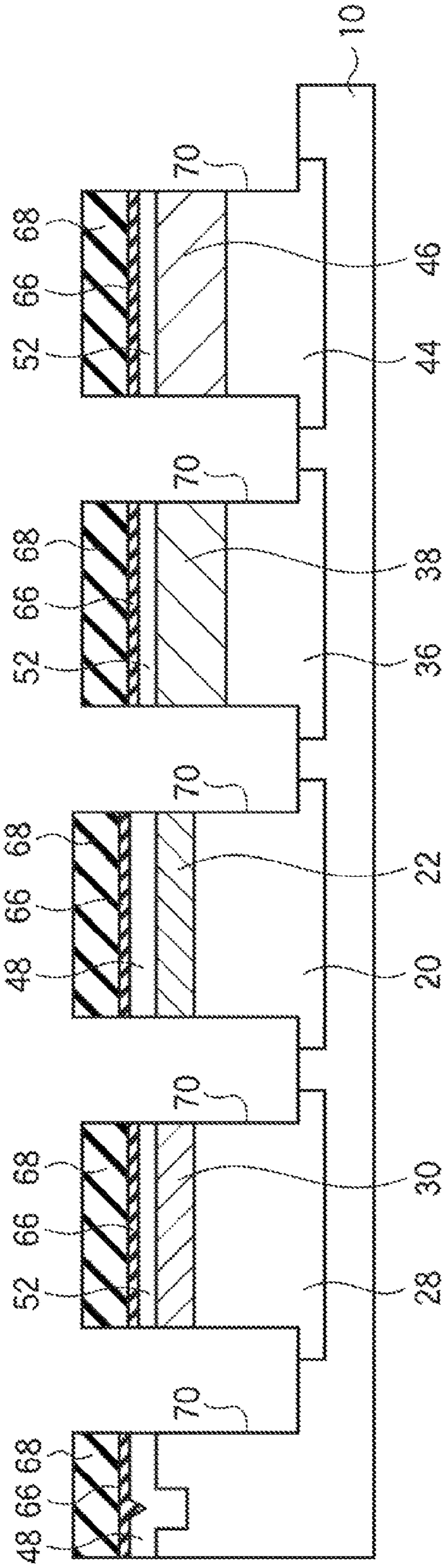

Next, by photolithography and dry etching, the silicon nitride film 68, the silicon oxide film 66, the silicon layer 48, 52 and the silicon substrate 10 are anisotropically etched to form a device isolation trench 70 in the device isolation region containing the regions between the respective transistor forming regions (FIG. 11). For the alignment for the photolithography, the trench 12 is used as the alignment mark.

Next, by, e.g., ISSG method, the surface of the silicon layer 48 and the silicon substrate 10 are wet oxidized under a decreased pressure to form a silicon oxide film of, e.g., a 2 nm-thickness as the liner film on the inside walls of the device isolation trench 70. As the processing conditions, for example, the temperature is set at 810° C., and the processing period of time is set at 12 seconds.

Next, by, e.g., high density plasma CVD method, a silicon oxide film of, e.g., a 500 nm-thickness is deposited to fill the device isolation trench 70 by the silicon oxide film.

Figure 12:
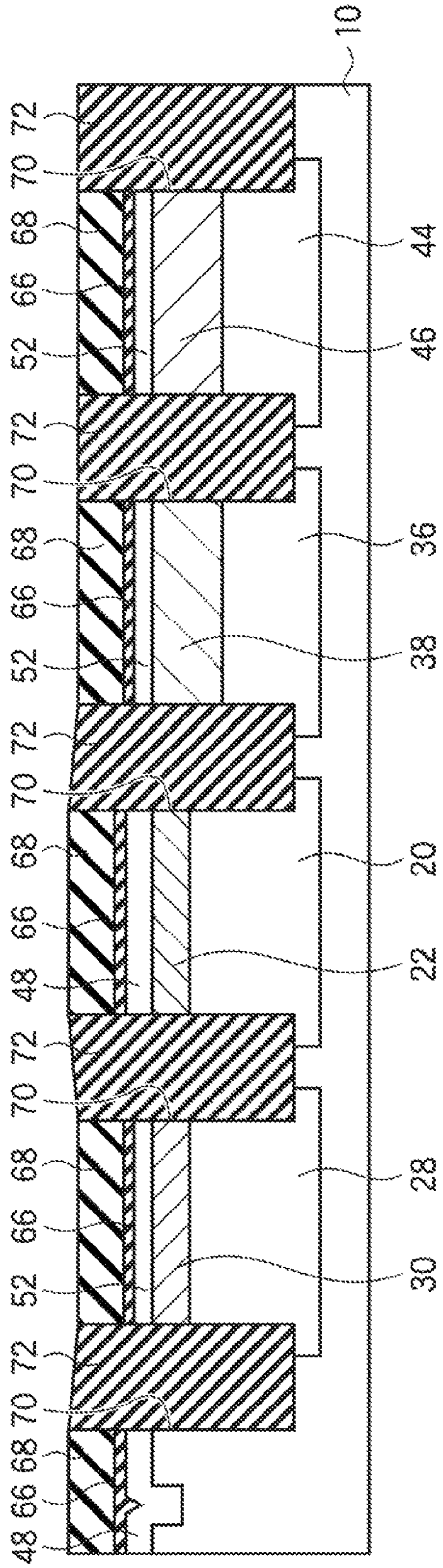

Then, by, e.g., CMP method, the silicon oxide film above the silicon nitride film 68 is removed. Thus, by the so-called STI (Shallow Trench Isolation) method, the device isolation insulating film 72 of the silicon oxide film buried in the device isolation trench 70 is formed (FIG. 12).

Next, by, e.g., wet etching with hydrofluoric acid aqueous solution and with the silicon nitride film 68 as the mask, the device isolation insulating film 72 is etched by, e.g., about 30 nm. This etching is for adjusting the surface of the silicon layer 48, 52 of the completed transistors and the surface of the device isolation insulating film 72 to be on the substantially the same height.

Figure 13:
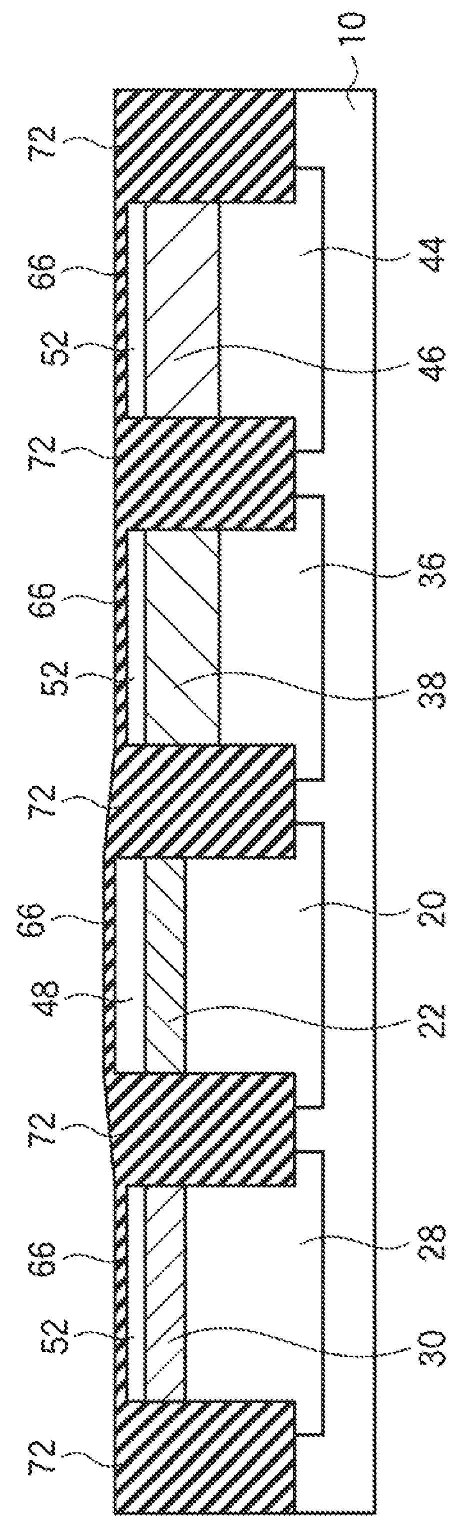

Next, by, e.g., wet etching with hot phosphoric acid, the silicon nitride film 68 is removed (FIG. 13).

Next, by wet etching using, e.g., hydrofluoric acid aqueous solution, the silicon oxide film 66 is removed.

Figure 14:
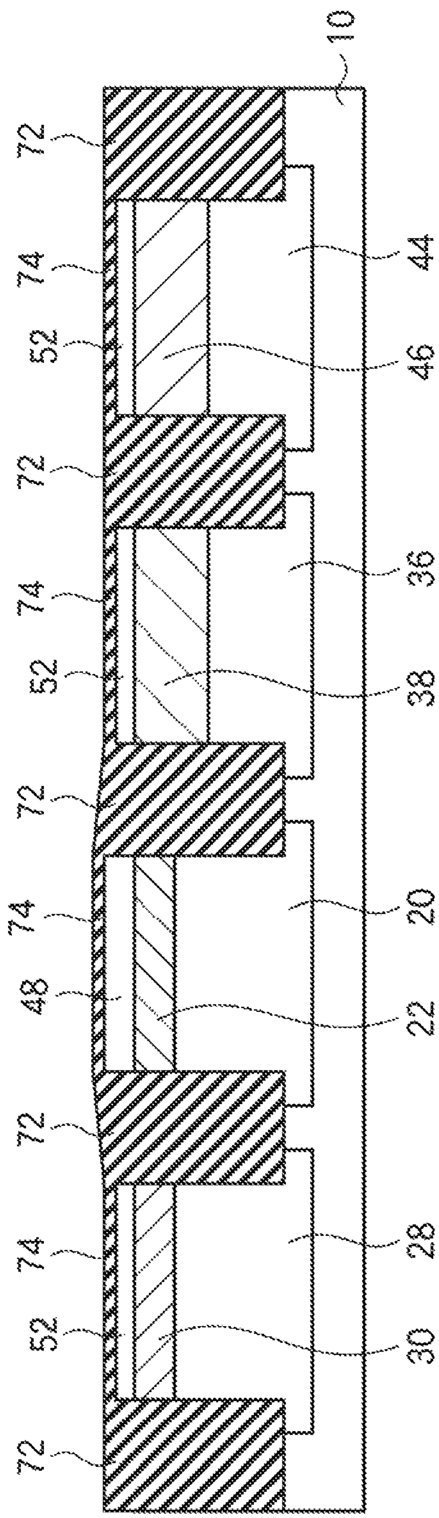

Next, by thermal oxidation method, a silicon oxide film 74 of, e.g., a 7 nm-thickness is formed (FIG. 14). As the processing conditions, for example, the temperature is set at 750° C., and the processing period of time is set at 52 minutes.

Next, by photolithography, a photoresist film 76 covering the high voltage transistor forming regions 32, 40 and exposing the low voltage transistor forming regions 16, 24 is formed.

Figure 15:
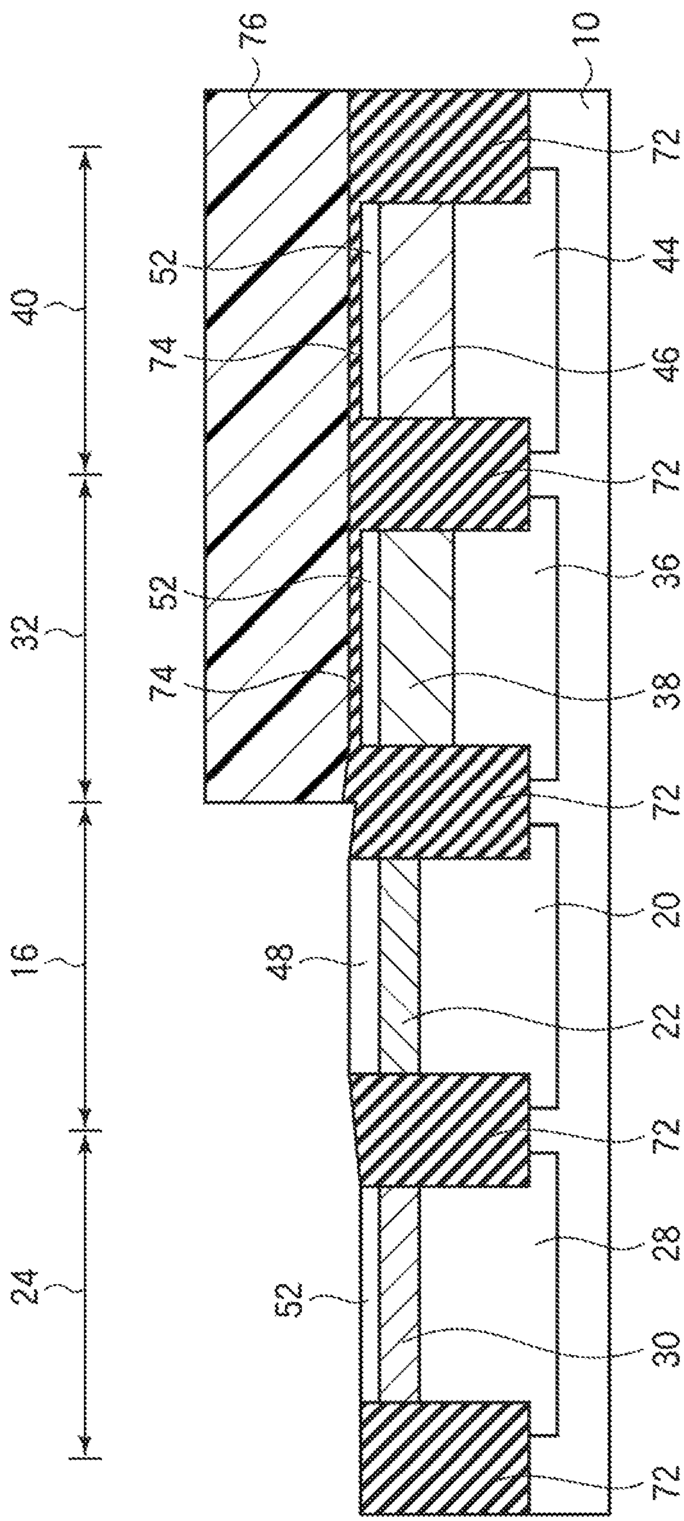

Then, by, e.g., wet etching with hydrofluoric acid aqueous solution and with the photoresist film 76 as the mask, the silicon oxide film 74 is etched. Thus, the silicon oxide film 74 in the low voltage PMOS transistor forming region 16 and the low voltage NMOS transistor forming region 24 is removed (FIG. 15).

Then, by, e.g., asking method, the photoresist film 62 is removed.

Next, by thermal oxidation method, a silicon oxide film 78 of, e.g., a 2 nm-thickness is formed. As the processing conditions, for example, the temperature is set at 810° C., and the processing period of time is set at 8 seconds.

Next, thermal processing of, e.g., 870° C. and 13 seconds is made in NO atmosphere to introduce nitrogen into the silicon oxide films 74, 78.

Figure 16:
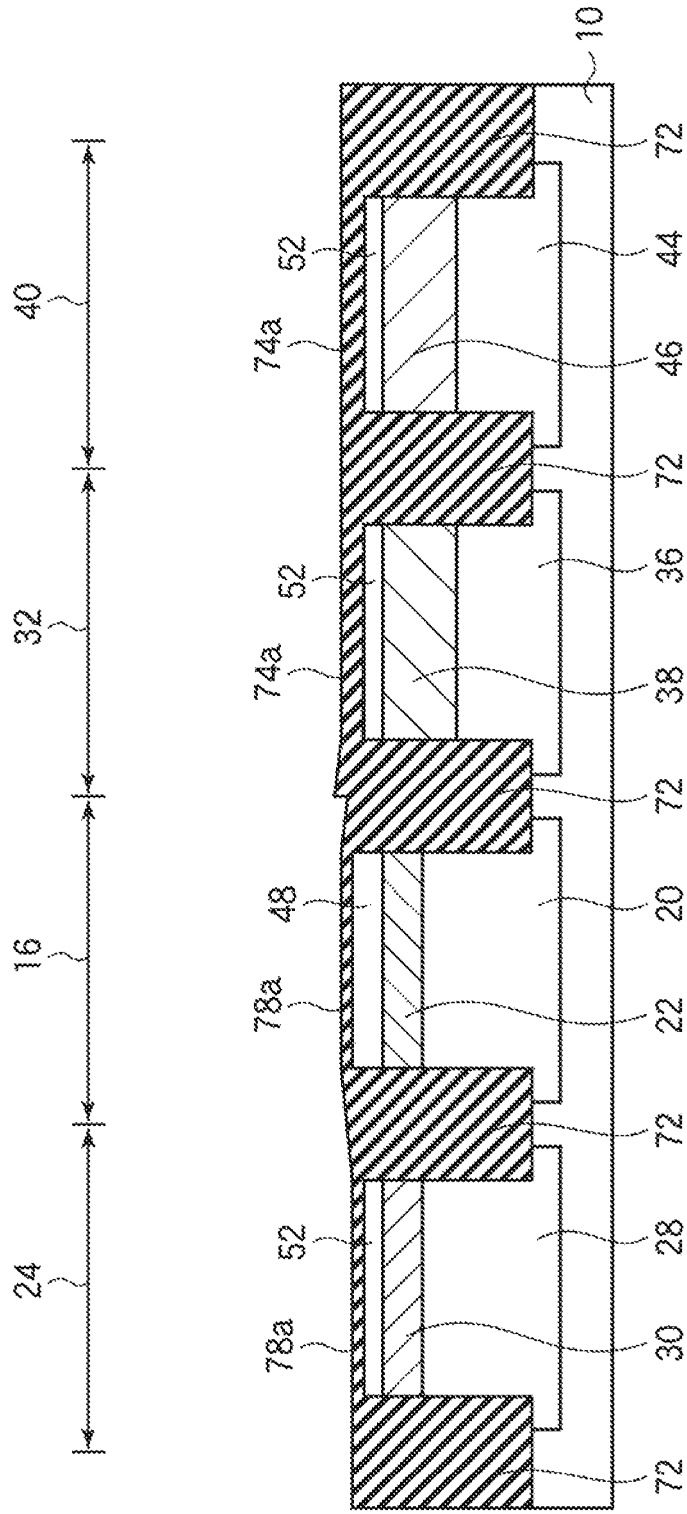

Thus, the gate insulating films 74*a* of the silicon oxide film 74 are formed in the high voltage NMOS transistor forming region 32 and the high voltage PMOS transistor forming region 40. In the low voltage PMOS transistors forming region 16 and the low voltage NMOS transistors forming region 24, the gate insulating films 78*a* of the silicon oxide film 78 thinner than the silicon oxide film 74 are formed (FIG. 16).

Then, above the entire surface, a non-doped polycrystalline silicon film of, e.g., a 100 nm-thickness is deposited by, e.g., LPCVD method. As the processing conditions, for example, the temperature is set at 605° C.

Figure 17:
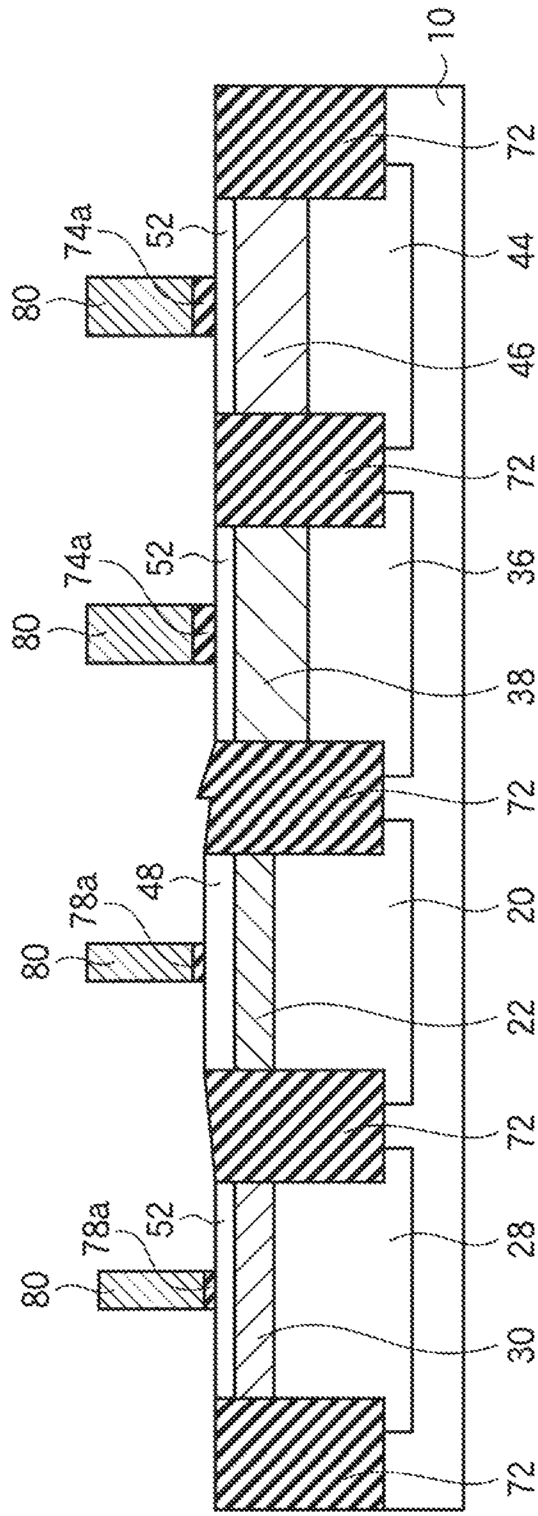

Next, by photolithography and dry etching, the polycrystalline silicon film is patterned to form the gate electrodes 80 in the respective transistor forming regions (FIG. 17).

Next, by photolithography and ion implantation, n-type impurity ions are implanted selectively in the high voltage NMOS transistor forming region 32 with the gate electrode 80 as the mask to form n-type impurity layers 82 to be the LDD regions. The n-type impurity layers 82 are formed by implanting, e.g., phosphorus ions under the conditions of 35 keV acceleration energy and $2\times10^{13}$ $cm^{-2}$ dose.

Next, by photolithography and ion implantation, p-type impurity ions are implanted selectively in the high voltage PMOS transistor forming region 40 with the gate electrode 80 as the mask to form p-type impurity layers 84 to be the LDD regions. The p-type impurity layers 84 are formed by implanting, e.g., boron ions under the conditions of 10 keV acceleration energy and $2\times10^{13}$ $cm^{-2}$ dose.

Next, by photolithography and ion implantation, n-type impurity ions are implanted selectively in the low voltage NMOS transistor forming region 24 with the gate electrode 80 as the mask to form n-type impurity layers 86 to be the extension regions. The n-type impurity layers 86 are formed by implanting, e.g., arsenic ions at 6 keV acceleration energy and $2\times10^{14}$ $cm^{-2}$ dose.

Figure 18:
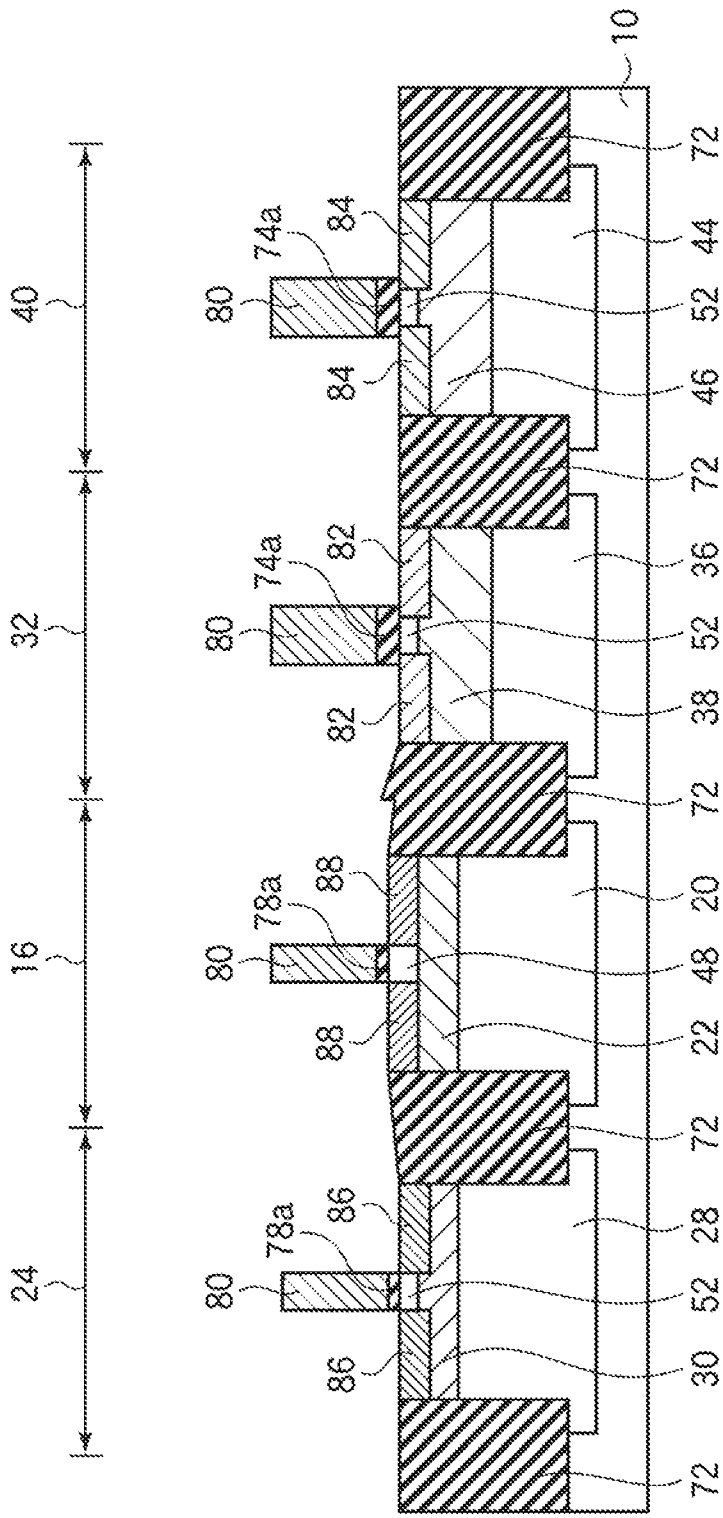

Then, by photolithography and ion implantation, p-type impurity ions are implanted selectively in the low voltage PMOS transistor forming region 16 with the gate electrode 80 as the mask to form p-type impurity layers 88 to be the extension regions (FIG. 18). The p-type impurity layers 88 are formed by implanting, e.g., boron ions at 0.6 keV acceleration energy and $7\times10^{24}$ $cm^{-2}$ dose.

Then, above the entire surface, a silicon oxide film of, e.g., an 80 nm-thickness is deposited by, e.g., CVD method. As the processing condition, for example, the temperature is set at 520° C.

Figure 19:
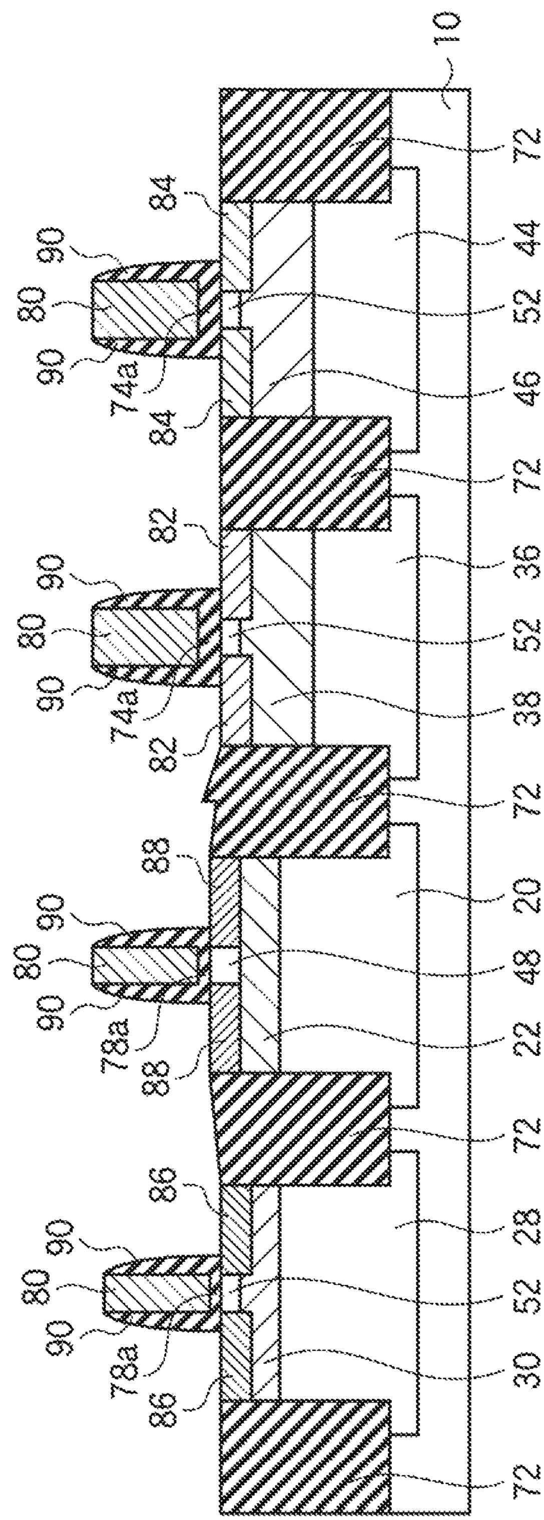

Next, the silicon oxide film deposited above the entire surface is anisotropically etched to be left selectively on the side walls of the gate electrodes 80. Thus, the sidewall spacers 90 of the silicon oxide film are formed (FIG. 19).

Next, by photolithography and ion implantation, ion implantation is made selectively in the low voltage NMOS transistor forming region 24 and the high voltage NMOS transistor forming region 32 with the gate electrodes 80 and the sidewall spacers 90 as the mask. Thus, the n-type impurity layers 92 to be the source/drain regions are formed, and n-type impurities are doped to the gate electrodes 80 of the NMOS transistors. As the conditions for the ion implantation, for example, phosphorus ions are implanted at 8 keV acceleration energy and at $1.2\times10^{26}$ $cm^{-2}$ dose.

Next, by photolithography and ion implantation, ion implantation is made selectively in the low voltage PMOS transistor forming region 16 and the high voltage PMOS transistor forming region 40 with the gate electrodes 80 and the sidewall spacers 90 as the mask. Thus, the p-type impurity layers 94 to be the source/drain regions are formed, and p-type impurities are doped to the gate electrodes 80 of the PMOS transistors. As the conditions for the ion implantation, for example, boron ions are ion implanted at 4 keV acceleration energy and $6\times10^{15}$ $cm^{-2}$ dose.

Then, rapid thermal processing of, e.g., 1025° C. and 0 second is made in an inert gas ambient atmosphere to activate the implanted impurities and diffuse the impurities in the gate electrodes 80. The thermal processing of 1025° C. and 0 second is sufficient to diffuse the impurities to the interfaces between the gate electrodes 80 and the gate insulating films.

Figure 20:
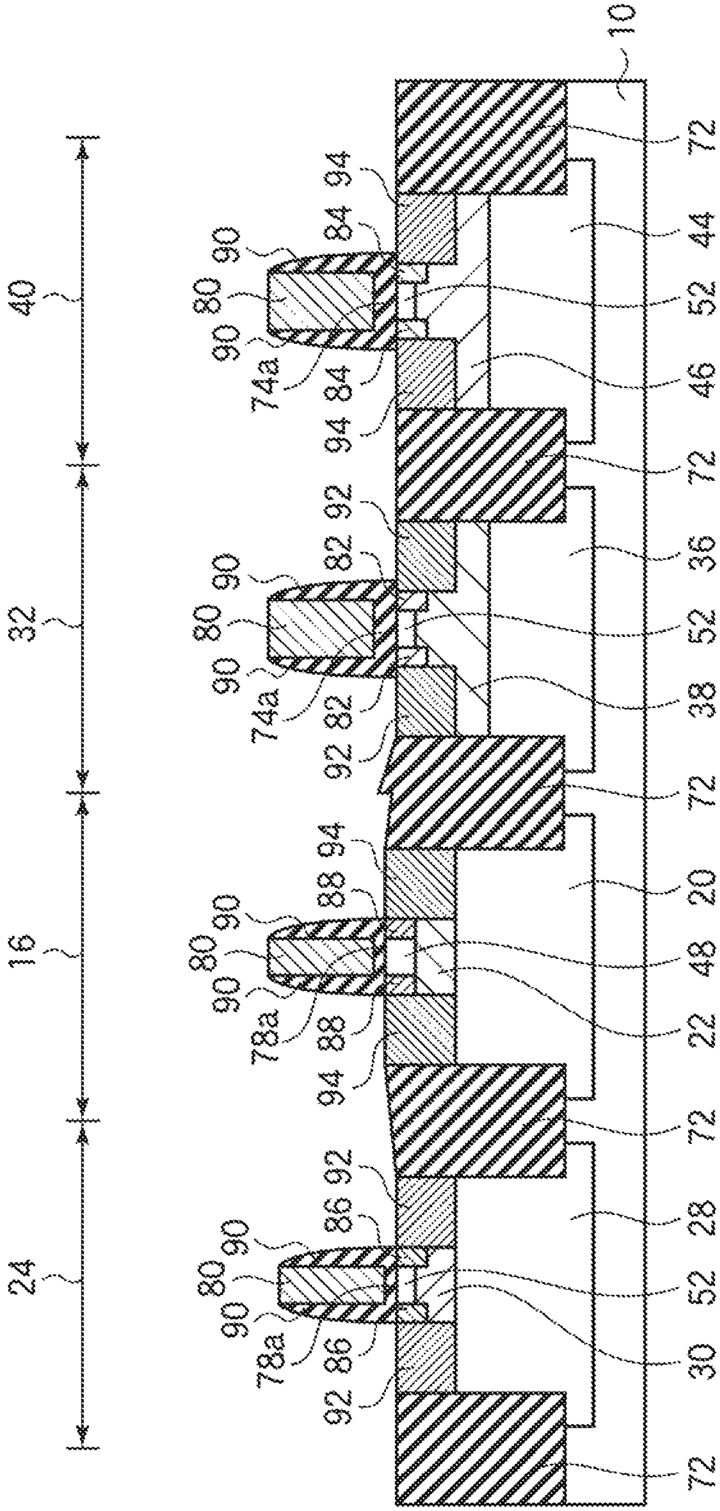

Thus, the 4 kinds of the transistors are completed on the silicon substrate 10. That is, in the low voltage NMOS transistor forming region 24, the low voltage NMOS transistor (LV NMOS) is formed. In the low voltage PMOS transistor forming region 16, the low voltage PMOS transistor (LV PMOS) is formed. In the high voltage NMOS transistor forming region 32, the high voltage NMOS transistor (HV NMOS) is formed. In the high voltage PMOS transistor forming region 40, the high voltage PMOS transistor (HV PMOS) is formed (FIG. 20).

Then, by salicide (self-aligned silicide) process, a metal silicide film 96 of, e.g., a cobalt silicide film is formed on the gate electrodes 80, the n-type impurity layers 92 and the p-type impurity layers 94.

Next, above the entire surface, a silicon nitride film of, e.g., a 50 nm-thickness is deposited by, e.g., CVD method to form the silicon nitride film as the etching stopper film.

Next, above the silicon nitride film, a silicon oxide film of, e.g., a 500 nm-thickness is deposited by, e.g., high density plasma CVD method.

Thus, the inter-layer insulating film 98 of the layer film of the silicon nitride film and the silicon oxide film is formed.

Next, the surface of the inter-layer insulating film 98 is polished by, e.g., CMP method to planarize.

Figure 21:
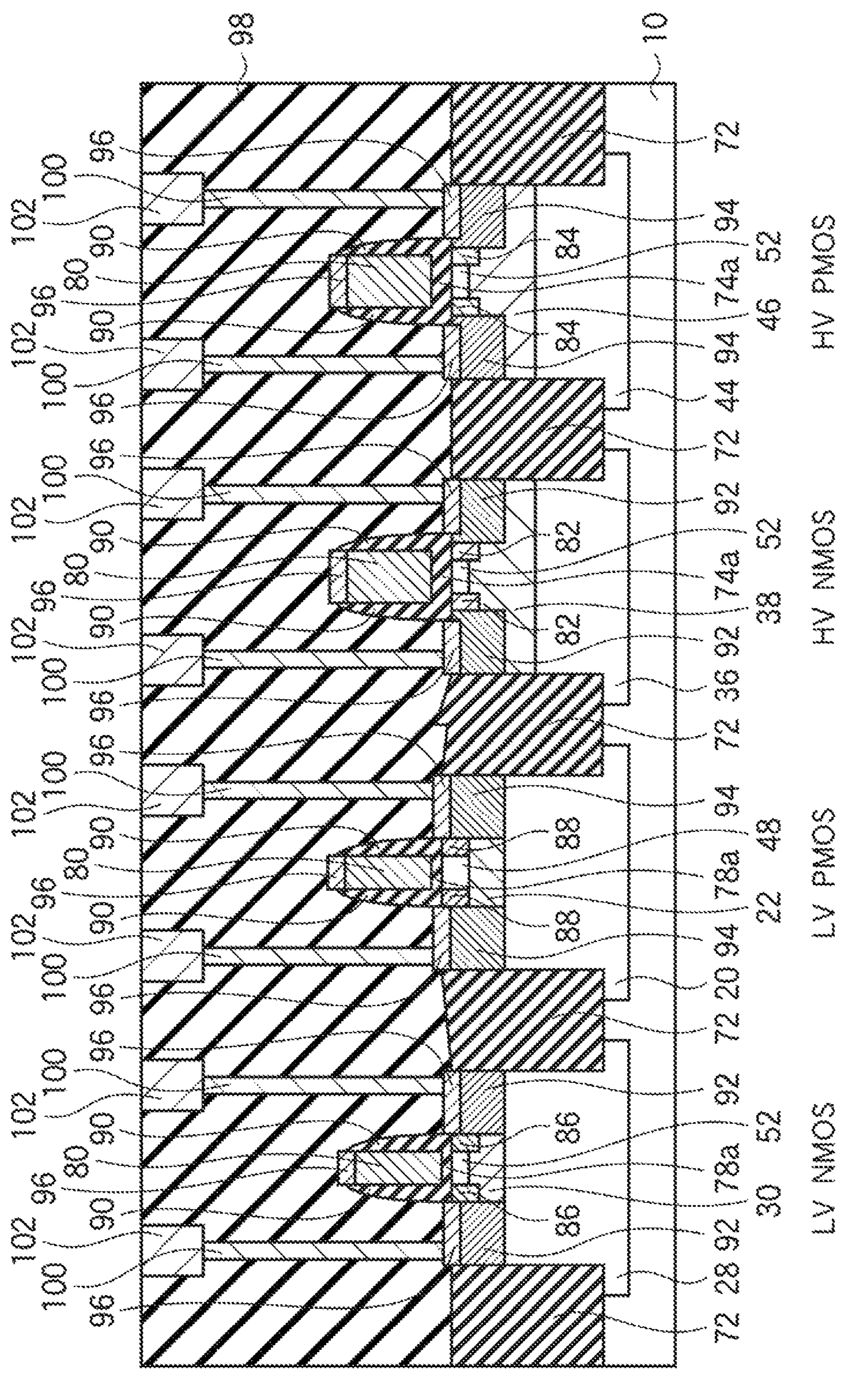
Figure 22:
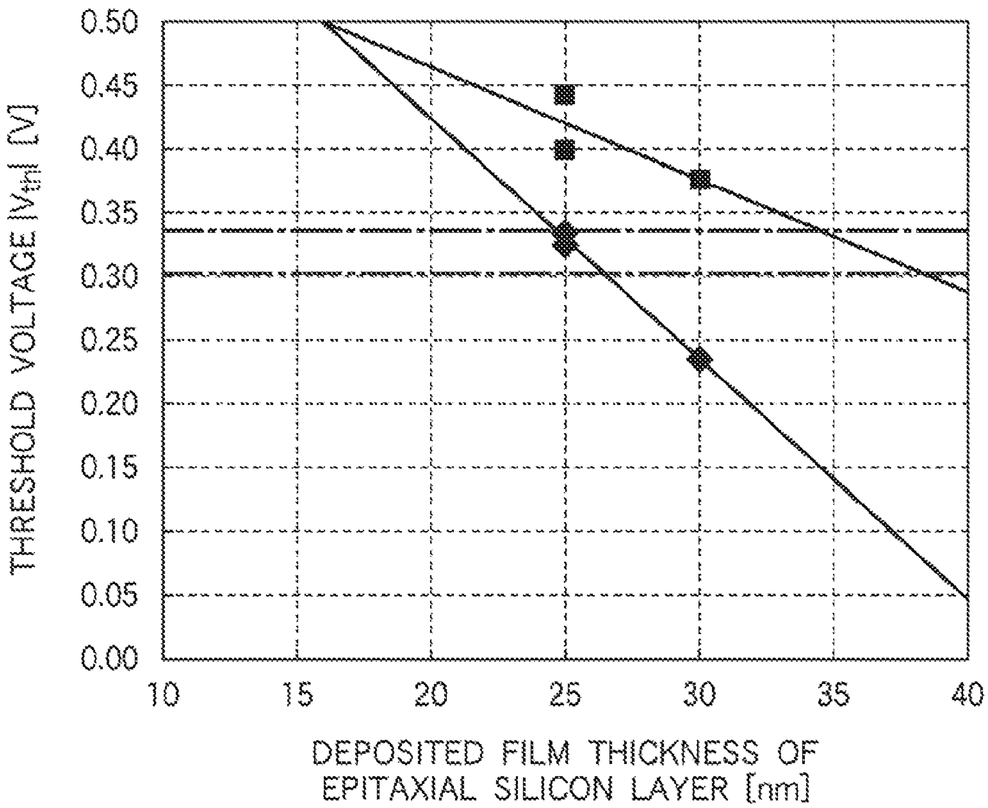
FIG. 22 is a graph illustrating relationships between the threshold voltage of the low voltage transistor and the deposited film thickness of the epitaxial silicon layer.

Then, the contact plugs 100 buried in the inter-layer insulating film 98, interconnections 102 connected to the contact plugs 100, and others are formed, and the semiconductor device is completed (FIG. 21).

As described above, according to the present embodiment, in consideration of different diffusion velocities between an n-type impurity and a p-type impurity, the film thickness of the epitaxial silicon layer is varied between the low voltage PMOS transistor forming region and the low voltage NMOS transistor forming region. Thus, both in the NMOS transistor and the PMOS transistor, the epitaxial silicon layer can have optimum film thickness to obtain target threshold voltages, and the control of the threshold voltages can be improved. Accordingly, the semiconductor device can have higher reliability.

[A Second Embodiment]

A method of manufacturing a semiconductor device according to a second embodiment will be described with reference to FIGS. 23 to 28. The same members of the present embodiment as those of the semiconductor device and the method of manufacturing the same according to the first embodiment illustrated in FIGS. 1 to 22 are represented by the same reference numbers not to repeat or to simplify their description.

FIGS. 23 to 28 are sectional views illustrating the method of manufacturing the semiconductor device according to the present embodiment.

In the present embodiment, another method of manufacturing the semiconductor device according to the first embodiment illustrated in FIG. 1 will be described.

First, in the same way as in the method of manufacturing the semiconductor according to the first embodiment illustrated in FIGS. 2 to 7, the n-wells 20, 44, the p-wells 28, 36, the n-type highly doped impurity layer 22, the p-type highly doped impurity layer 30, the p-type impurity layer 38, the n-type impurity layer 46, etc. are formed in the silicon substrate 10 (see FIG. 7).

Next, the photoresist film 42 is removed by, e.g., ashing method.

Then, thermal processing is made in an inert ambient atmosphere to recover ion implantation damages made in the silicon substrate 10 while activating the implanted impurities.

Next, the silicon oxide film 14 is removed by, e.g., wet etching using hydrofluoric acid aqueous solution.

Figure 23:
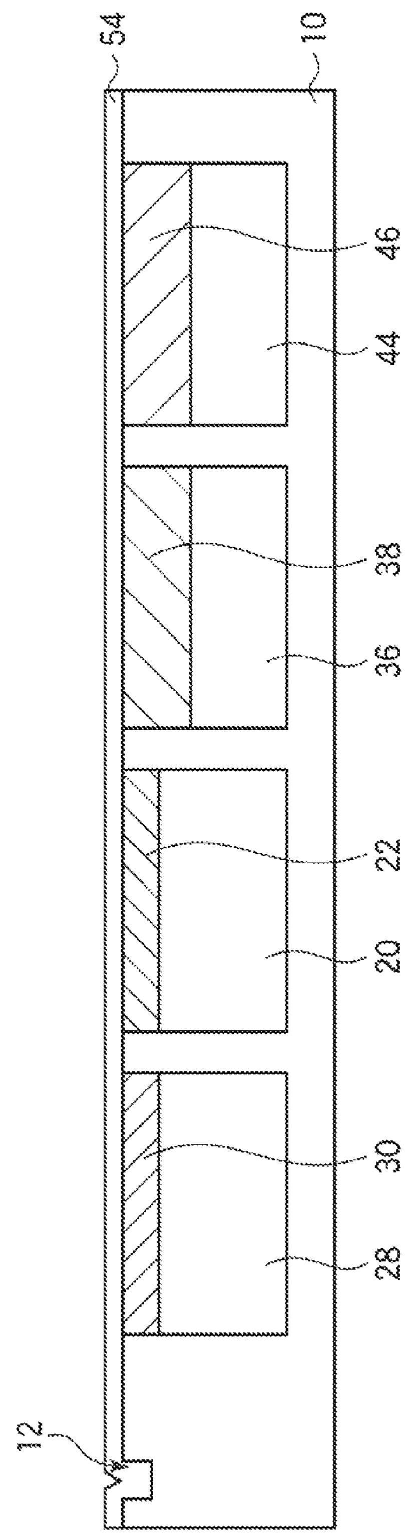
FIGS. 23-28 are sectional views illustrating a method of manufacturing the semiconductor device according to a second embodiment.

Next, a non-doped silicon layer 54 of, e.g., a nm-thickness is epitaxially grown on the surface of the silicon substrate 10 by, e.g., CVD method (FIG. 23).

Next, a silicon oxide film 56 of, e.g., a 3 nm-thickness is formed above the silicon layer 54 by CVD method.

Figure 24:
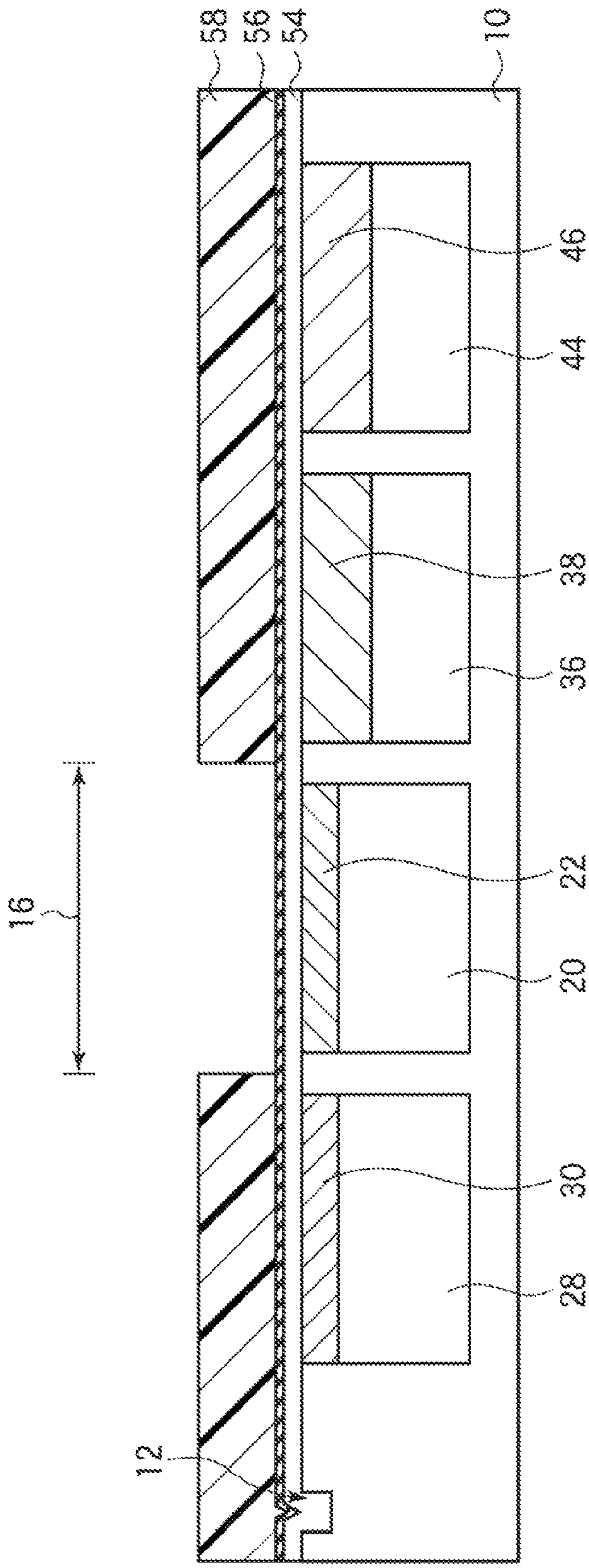

Then, above the silicon oxide film 56, a photoresist film 58 exposing the low voltage PMOS transistor forming region 16 and covering the reset regions is formed by photolithography (FIG. 24). For the alignment for the photolithography, the trench 12 is used as the alignment mark.

Figure 25:
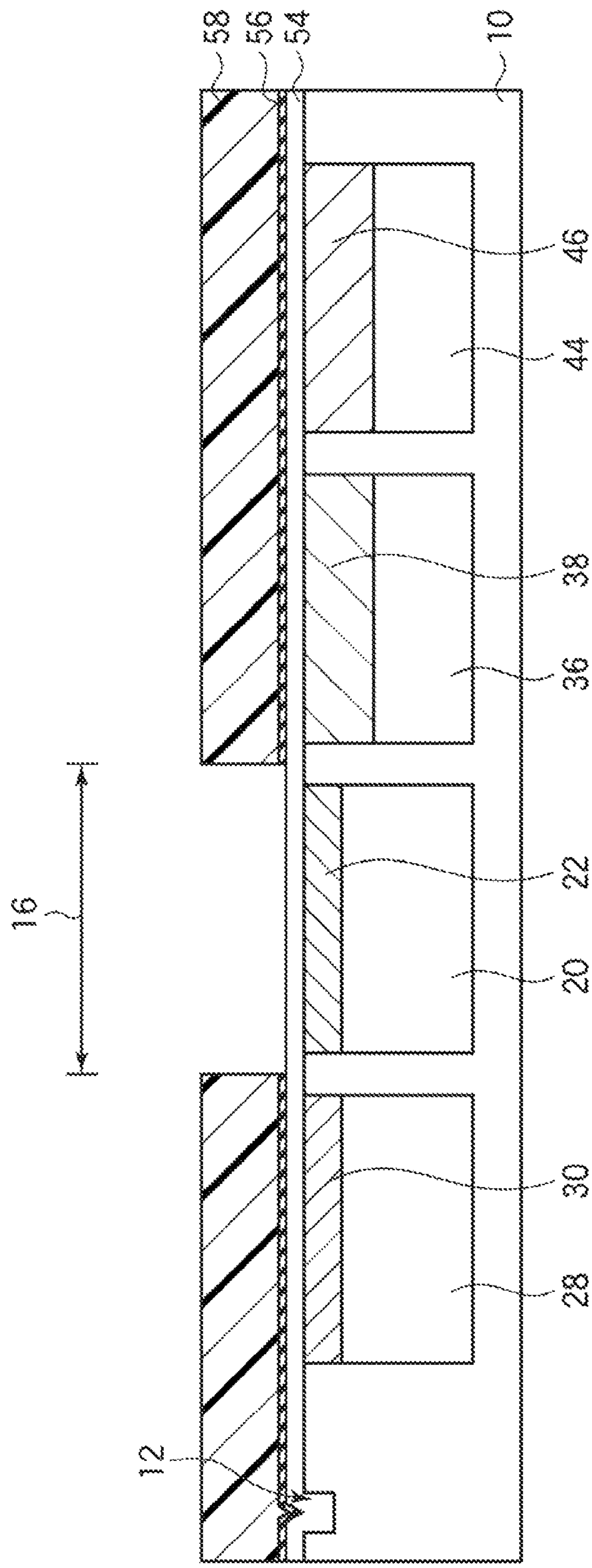

Next, with the photoresist film 58 as the mask, the silicon oxide film 56 in the low voltage PMOS transistor forming region 16 is removed by, e.g., wet etching using hydrofluoric acid aqueous solution or dry etching (FIG. 25).

Figure 26:
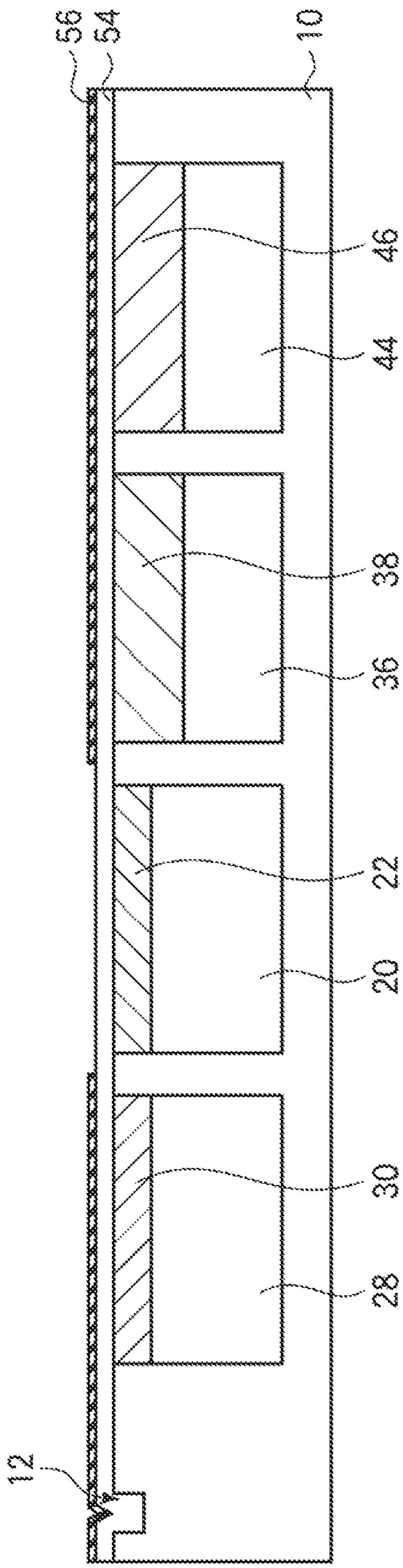

Next, the photoresist film 58 is removed by, e.g., ashing method (FIG. 26).

Figure 27:
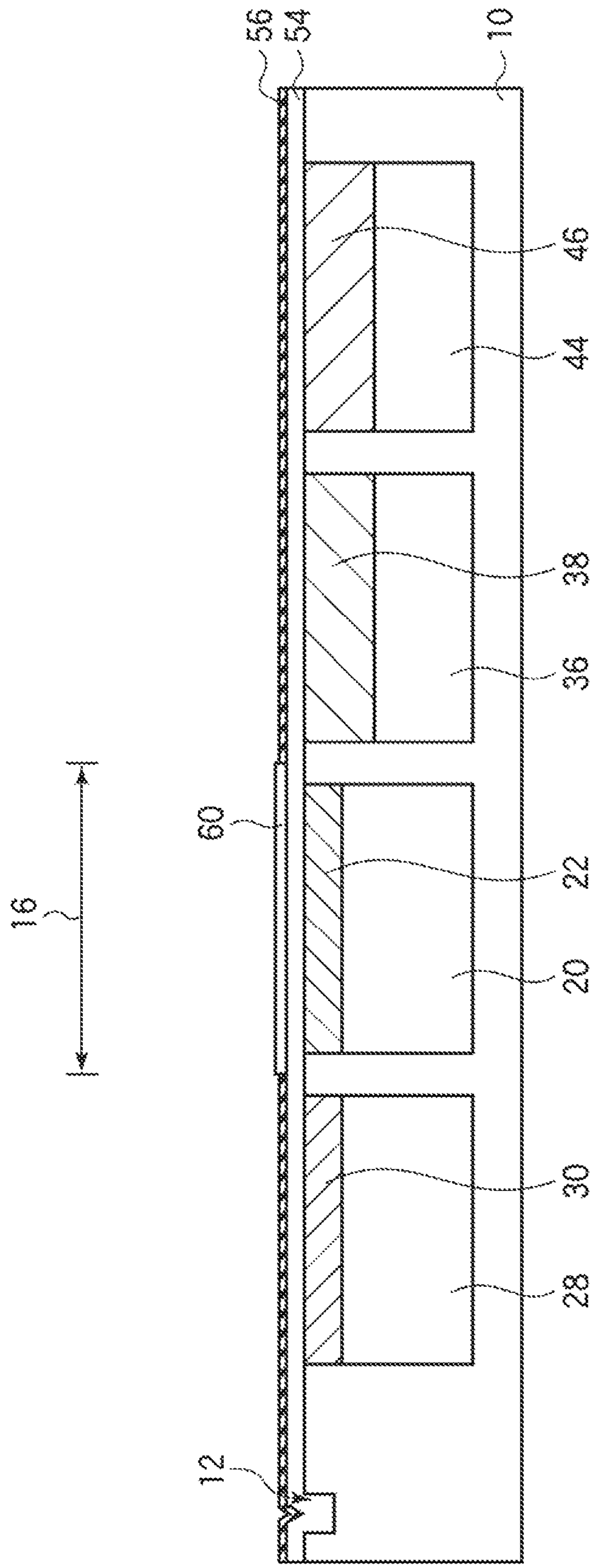
Figure 28:
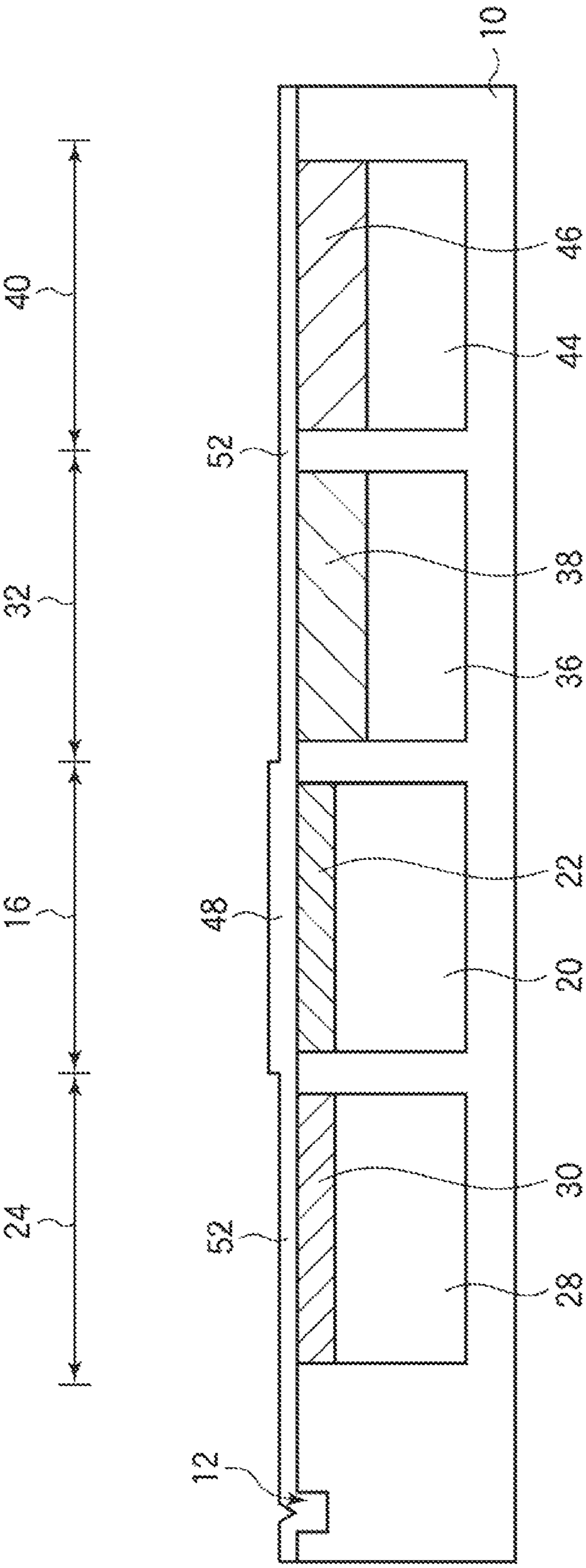

Next, with the patterned silicon oxide film 56 as the mask, a non-doped silicon layer 60 of, e.g., a 8 nm-thickness is epitaxially grown selectively on the silicon layer 54 in the region not covered by the silicon oxide film 56 (FIG. 27).

Then, the silicon oxide film 58 is removed by, e.g., wet etching using hydrofluoric acid aqueous solution or dry etching.

Thus, in the low voltage PMOS transistor forming region 16, the silicon layer 48 formed of the layer film of the 26 nm-thickness silicon layer 54 and the 8 nm-thickness silicon layer 60 is formed. In the low voltage NMOS transistor forming region 24 and the high voltage transistor forming regions 32, 40, the silicon layer 52 formed of the 26 nm-thickness silicon layer 54 is formed.

Hereafter, on the same way as in the method of manufacturing the semiconductor device according to the first embodiment illustrated in FIGS. 11 to 21, the semiconductor device according to the first embodiment illustrated in FIG. 1 is completed.

As described above, according to the present embodiment, in consideration of different diffusion velocities between an n-type impurity and a p-type impurity, the film thickness of the epitaxial silicon layer is varied between the low voltage PMOS transistor forming region and the low voltage NMOS transistor forming region. Thus, both in the NMOS transistor and the PMOS transistor, the epitaxial silicon layer can have optimum film thickness to obtain target threshold voltages, and the control of the threshold voltages can be improved. Accordingly, the semiconductor device can have higher reliability.

[A Third Embodiment]

A semiconductor device and a method of manufacturing a semiconductor device according to a third embodiment will be described with reference to FIGS. 29 to 39. The same members of the present embodiment as those of the semiconductor device and method of manufacturing the same according to the first and the second embodiments illustrated in FIGS. 1 to 28 are represented by the same reference numbers not to repeat or to simplify the description.

Figure 29:
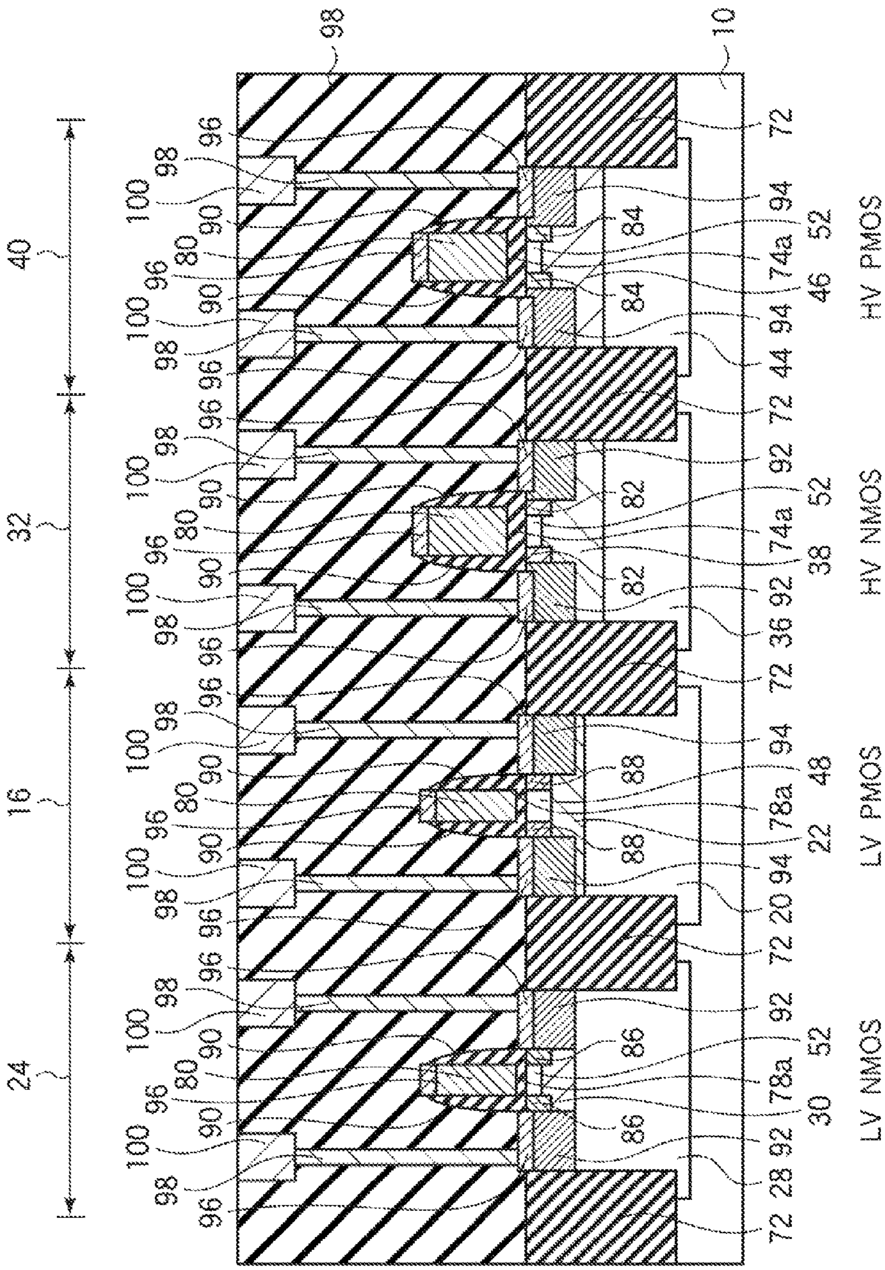
FIG. 29 is a diagrammatic sectional view illustrating a structure of a semiconductor device according to a third embodiment.

FIG. 29 is a diagrammatic sectional view illustrating a structure of the semiconductor device according to the present embodiment. FIGS. 30-39 are sectional views illustrating a method of manufacturing the semiconductor device according to the present embodiment.

First, the structure of the semiconductor device according to the present embodiment will be described with reference to FIG. 29.

The semiconductor device according to the present embodiment has the basic structures of the respective transistors which are the same as those of the semiconductor device according to the first embodiment illustrated in FIG. 1. The semiconductor device according to the present embodiment is different from the semiconductor device according to the first embodiment in that in the former, the height of the surface of the silicon layer 48 of the low voltage PMOS transistor and the height of the surface of the silicon layer 52 of the low voltage NMOS transistor are the same.

In the first embodiment, the silicon layer 52 is formed by etching the silicon layer 48 in the low voltage NMOS transistor forming region 24, and accordingly the height of the surface of the silicon layer 48 and the height of the surface of the silicon layer 52 are different. In the second embodiment, the silicon layer 60 is grown selectively on the silicon layer 54 in the low voltage PMOS transistor forming region 16, and accordingly the height of the surface of the silicon layer 48 and the height of the surface of the silicon layer 52 are different.

The height of the surface of the silicon layer 48 and the height of the surface of the silicon layer 52 are made equal to each other, whereby the planarity of the substrate surface can be improved, which facilitates the manufacturing process of the later steps. This requires no mask, which can decrease the step number and resultantly decrease the manufacturing cost.

Next, the method of manufacturing the semiconductor device according to the present embodiment will be described with reference to FIGS. 30 to 39.

First, by photolithography and etching, a trench 12 to be used as the mark for the mask alignment is formed in a region other than the product to be formed region of the silicon substrate 10 (e.g., a scribe region).

Figure 30:
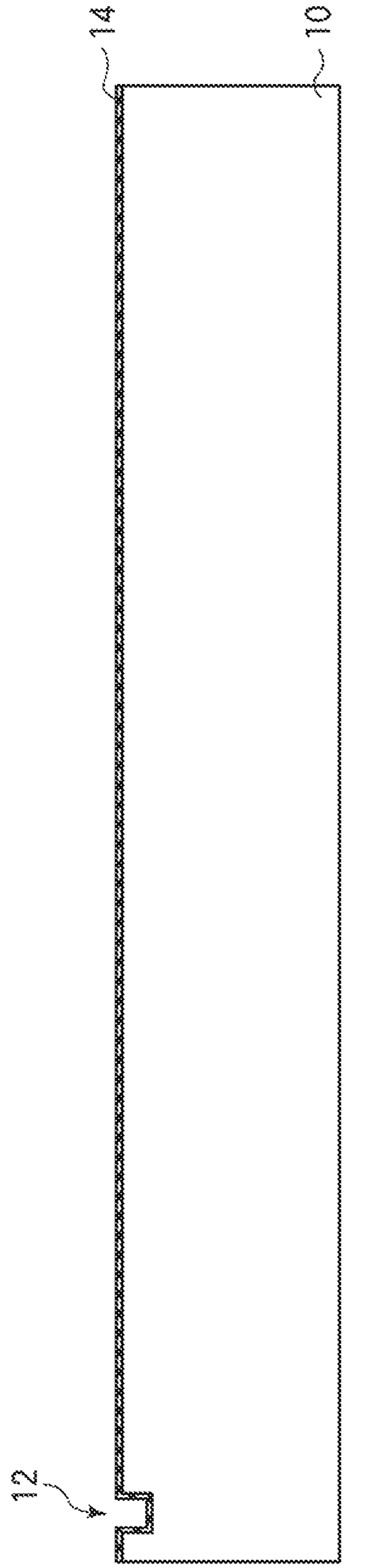
FIGS. 30-39 are sectional views illustrating a method of manufacturing the semiconductor device according to the third embodiment.

Next, above the entire surface of the silicon substrate 10, a silicon oxide film 14 as the protection film of the surface of the silicon substrate 10 is formed by, e.g., thermal oxidation method (FIG. 30).

Next, by photolithography, a photoresist film 18 exposing the low voltage PMOS transistor forming region 16 and covering the reset regions is formed. For the alignment for the photolithography, the trench 12 is used as the alignment mark.

Figure 31:
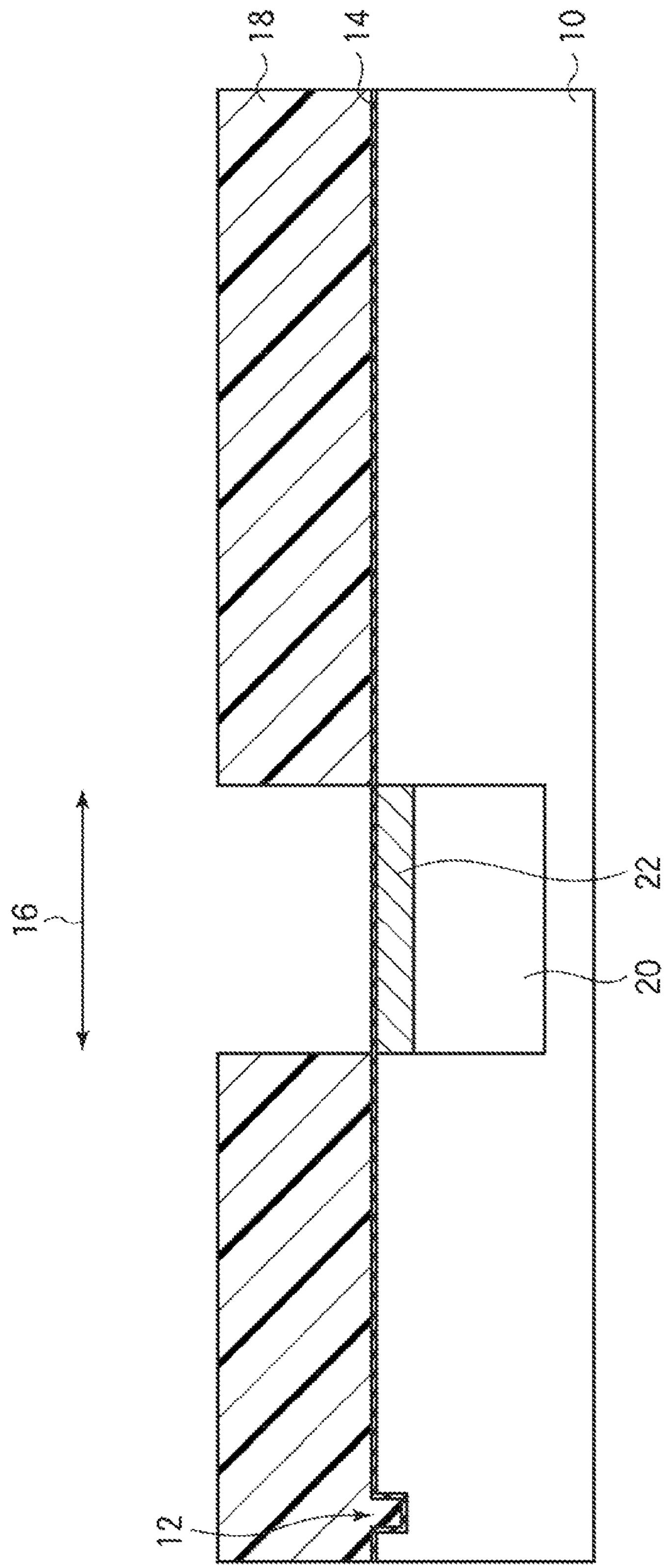

Then, ion implantation is made with the photoresist film 18 as the mask to form an n-well 20 and an n-type highly doped impurity layer 22 in the low voltage PMOS transistor forming region 16 (FIG. 31). For the ion implantation, the same conditions as, e.g., in the first embodiment can be used.

Next, the photoresist film 18 is removed by, e.g., asking method.

Next, thermal processing is made in an inert ambient atmosphere to recover ion implantation damages made in the silicon substrate 10 while activating the implanted impurity. For example, thermal processing of 600° C. and 150 seconds is made in nitrogen atmosphere.

Next, the silicon oxide film 14 is removed by, e.g., wet etching using hydrofluoric acid aqueous solution.

Figure 32:
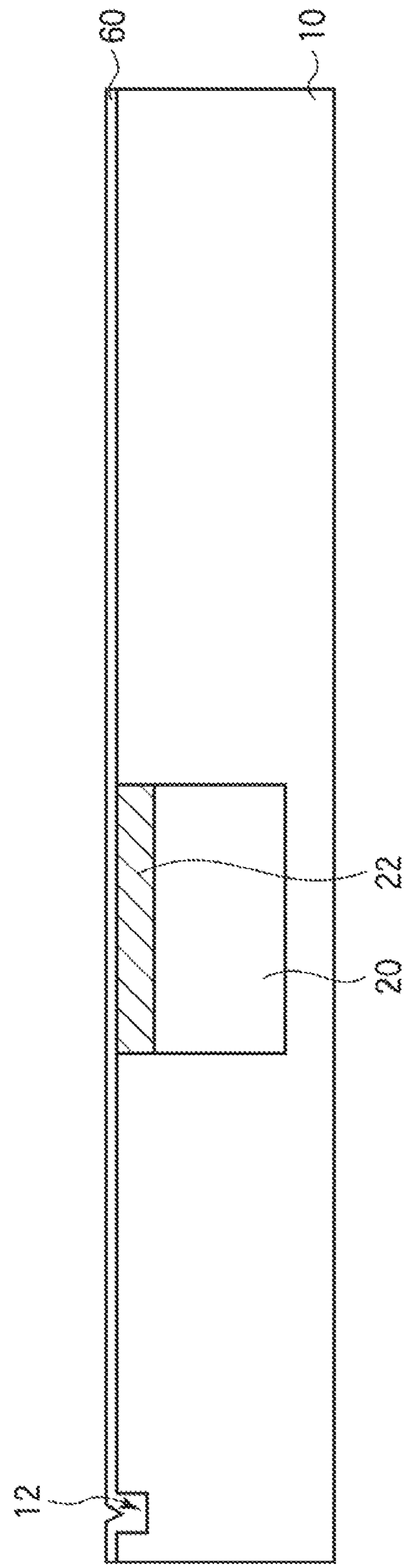

Next, the non-doped silicon layer 60 of, e.g., 8 nm-thickness is epitaxially grown on the surface of the silicon substrate 10 by, e.g., CVD method (FIG. 32).

Then, above the silicon layer 60, a silicon oxide film 62 as the surface protection film is formed by, e.g., thermal oxidation method.

Next, by photolithography, a photoresist film 34 exposing the high voltage NMOS transistor forming region and covering the reset regions is formed. For the alignment for the photolithography, the trench 12 is used as the alignment mark.

Figure 33:
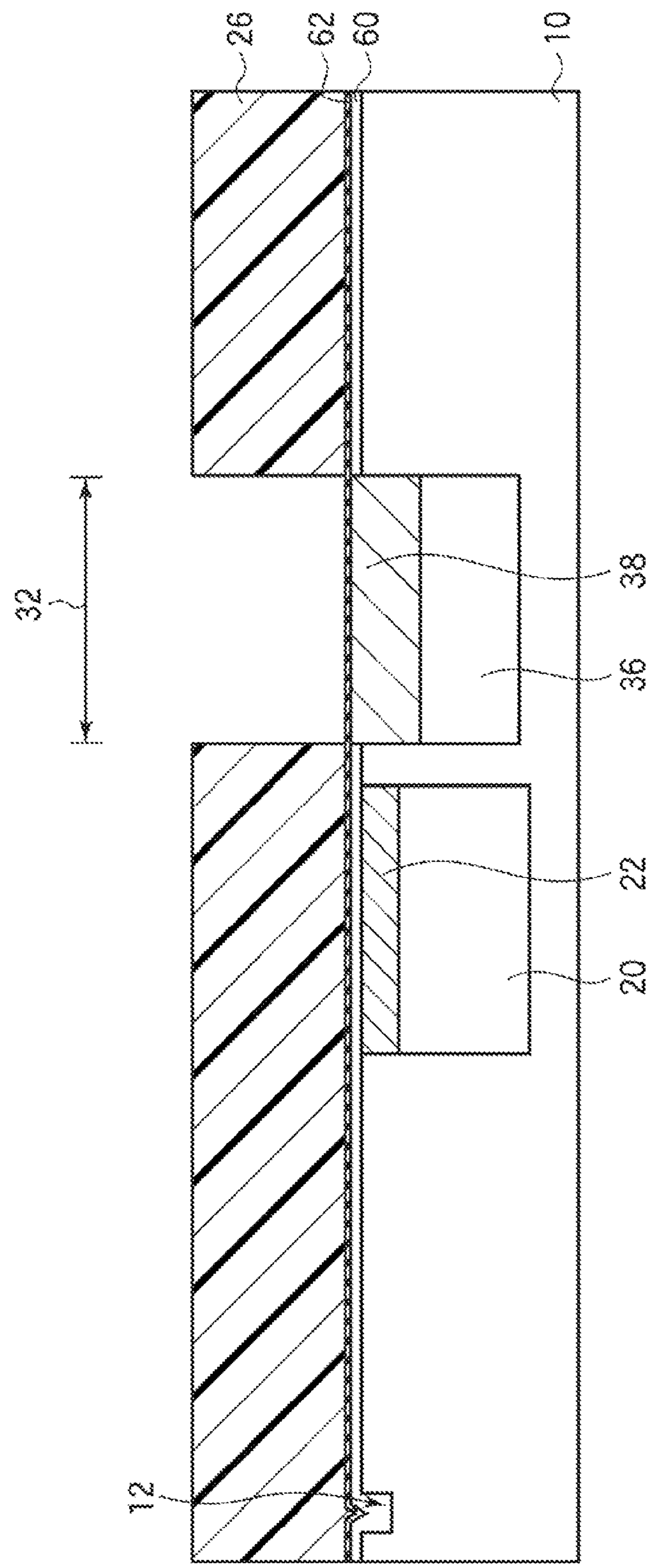

Next, ion implantation is made with the photoresist film 34 as the mask to form the p-well 36 and the p-type impurity layer 38 in the high voltage NMOS transistor forming region 32 of the silicon substrate 10 and the silicon layer 60 (FIG. 33). For the ion implantation, the same conditions as, e.g., in the first embodiment can be used.

Next, the photoresist film 34 is removed by, e.g., asking method.

Next, by photolithography, a photoresist film 42 exposing the high voltage PMOS transistor forming region 40 and covering the rest regions is formed. For the alignment for the photolithography, the trench 12 is used as the alignment mark.

Figure 34:
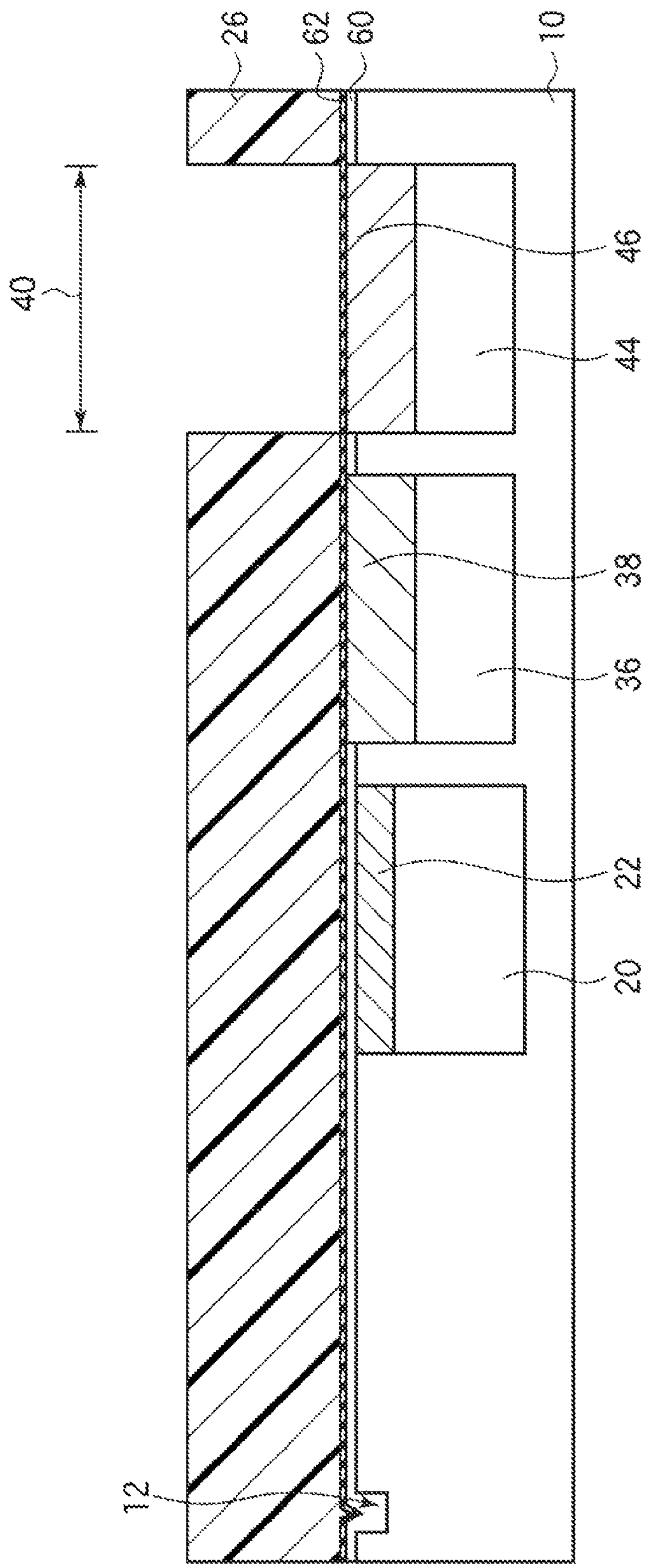

Next, ion implantation is made with the photoresist film 42 as the mask to form the n-well 44 and the n-type impurity layer 46 in the high voltage PMOS transistor forming region 40 of the silicon substrate 10 and the silicon layer 60 (FIG. 34). For the ion implantation, the same conditions as, e.g., in the first embodiment can be used.

Then, the photoresist film 42 is removed by, e.g., ashing method.

Next, by photolithography, a photoresist film 26 exposing the low voltage NMOS transistor forming region 24 and covering the reset regions is formed. For the alignment for the photolithography, the trench 12 is used as the alignment mark.

Figure 35:
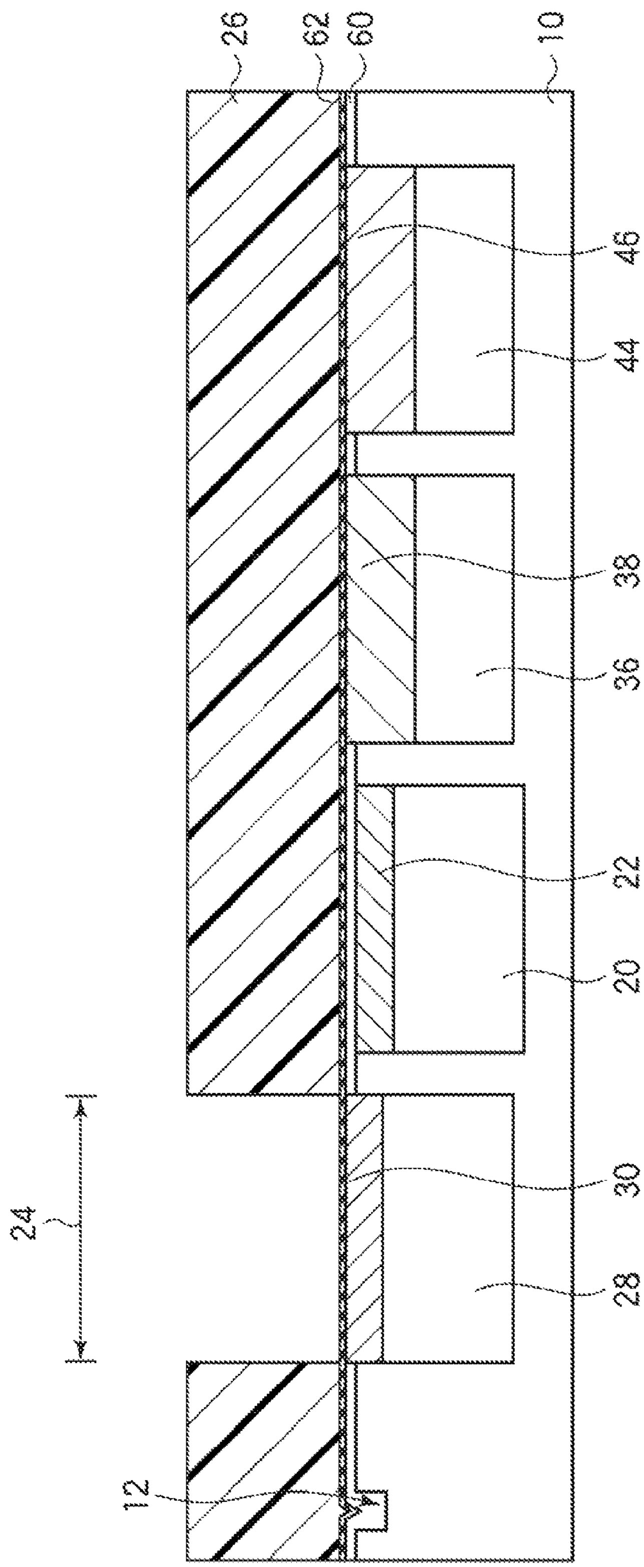
Figure 36:
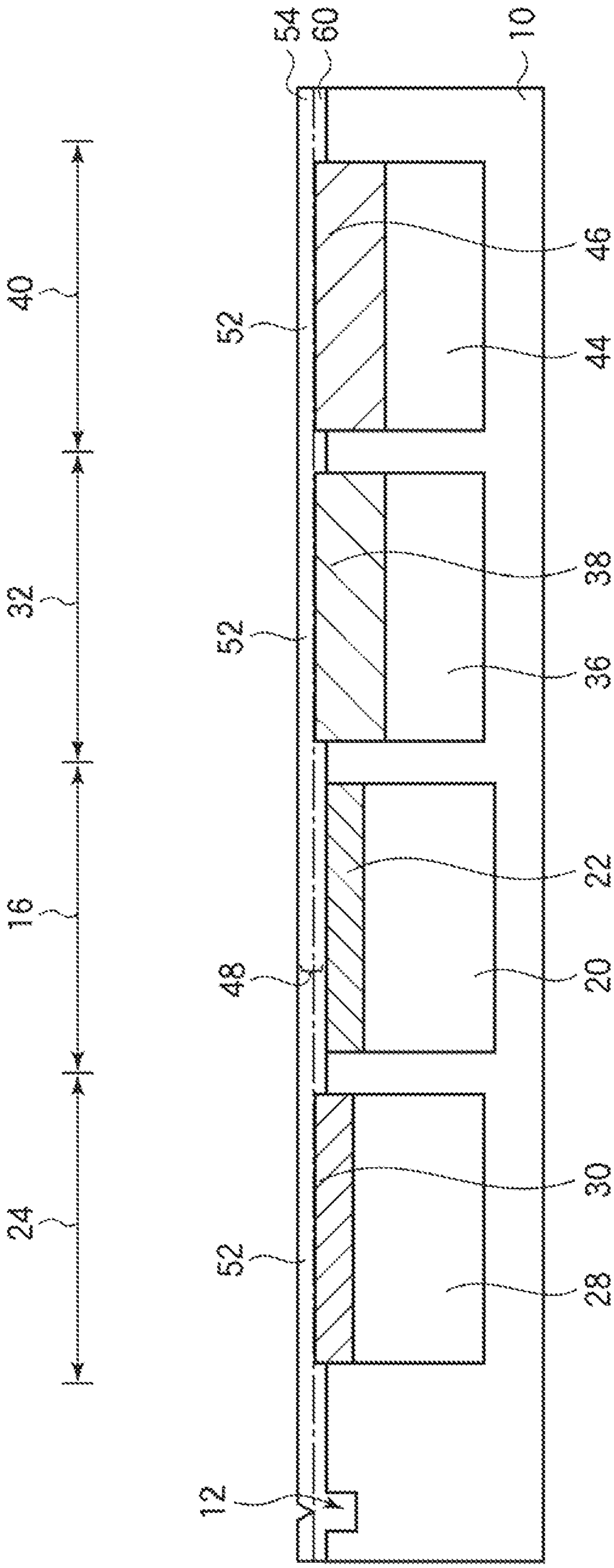

Then, ion implantation is made with the photoresist film 26 as the mask to form the p-well 28 and the p-type highly doped impurity layer 30 in the low voltage NMOS transistor forming region of the silicon substrate 10 and the silicon layer 60 (FIG. 35). For the ion implantation, the same conditions as, e.g., in the first embodiment can be used.

Next, the photoresist film 26 is removed by, e.g., ashing method.

The ion implantation for the low voltage NMOS transistor forming region 24, the high voltage NMOS transistor forming region 32 and the high voltage PMOS transistor forming region may be made first in any one of them.

Next, thermal processing is made in an inert ambient atmosphere to recover ion implantation damages introduced in the silicon substrate 10 and the silicon layer 60 while activating the implanted impurities. The thermal processing is made, for example, in nitrogen atmosphere at 600° C. and for 150 seconds.

Next, the silicon oxide film 62 is removed by, e.g., wet etching using hydrofluoric acid aqueous solution.

Next, the non-doped silicon layer 54 of, e.g. a 26 nm-thickness is epitaxially grown on the surface of the silicon layer 60 by, e.g., CVD method.

Thus, above the n-type highly doped impurity layer 22 of the low voltage PMOS transistor forming region 16, the silicon layer 48 of a 34 nm-thickness formed of the layer film of the 8 nm-thickness silicon layer 60 and the 26 nm-thickness silicon layer 54 is formed. Above the p-type highly doped impurity layer 30 of the low voltage NMOS transistor forming region 24, the p-type impurity layer 38 of the high voltage NMOS transistor forming region and the n-type impurity layer of the high voltage PMOS transistor forming region, the silicon layer 52 formed of the 26 nm-thickness silicon layer 54 is formed.

Figure 37:
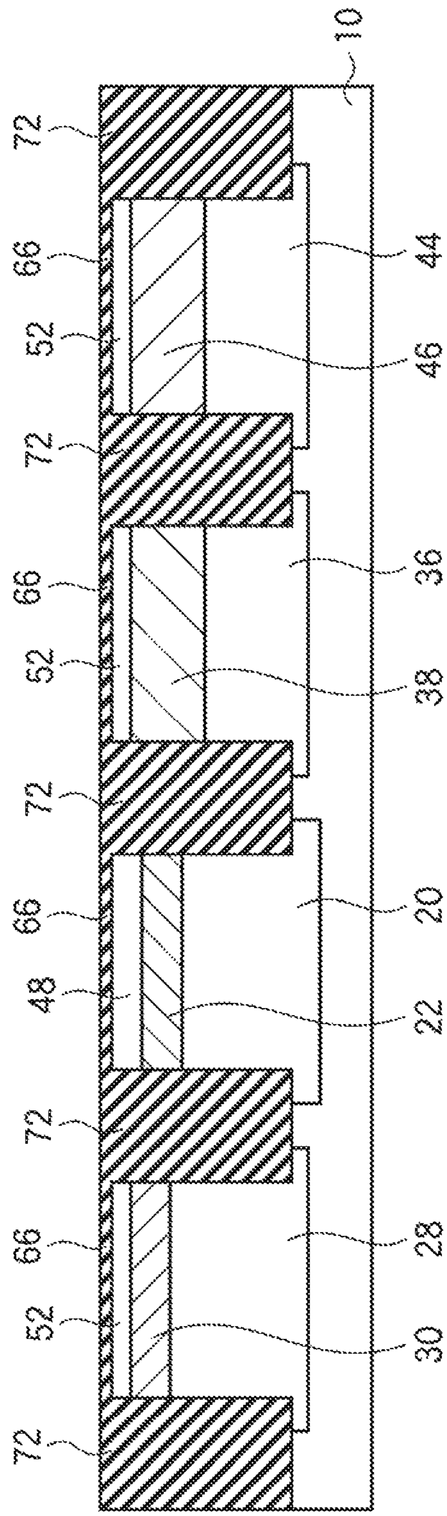

Then, in the same way as in the method of manufacturing the semiconductor device according to the first embodiment illustrated in FIGS. 11 to 13, the device isolation insulating film 72 defining the active regions is formed (FIG. 37). In the present embodiment, the height of the surface of the silicon layer 48 and the height of the surface of the silicon layer 52 are equal to each other, which facilitates the polishing in forming the device isolation insulating film 72. No mask is necessary, which can decrease the step number and resultantly the manufacturing cost.

Figure 38:
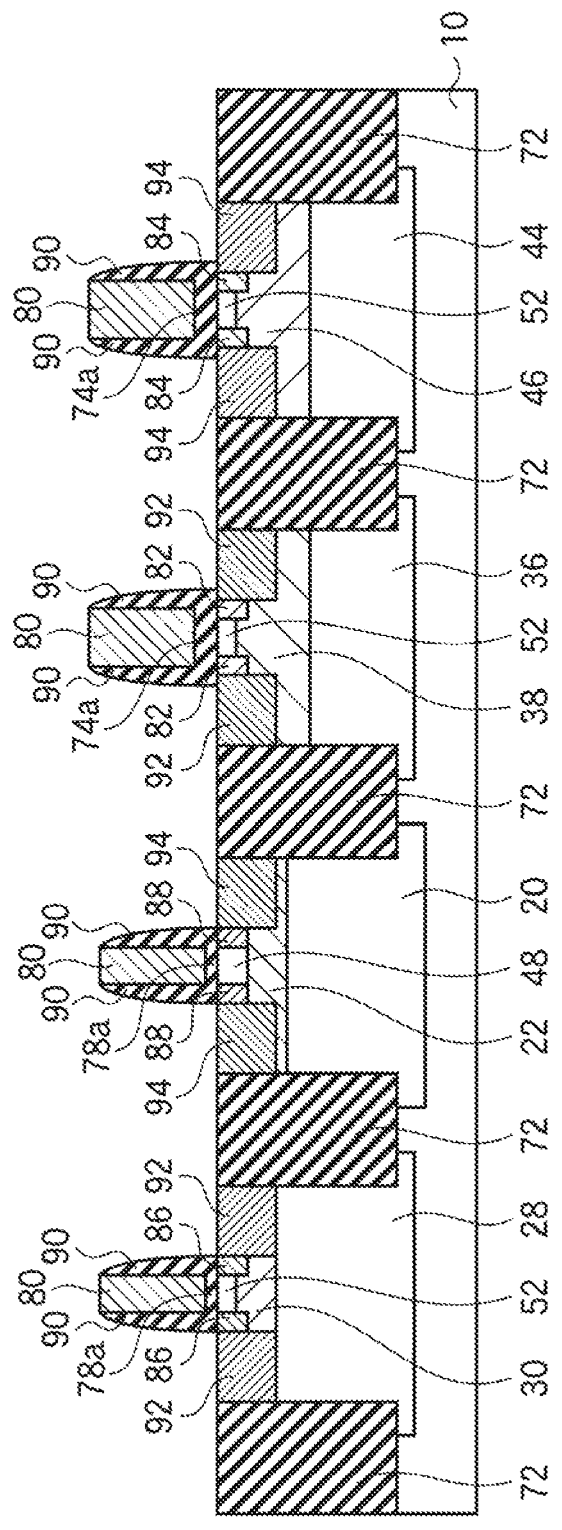

Next, in the same way as in the method of manufacturing the semiconductor device according to the first embodiment illustrated in FIGS. 14 to 20, the respective transistors are formed (FIG. 38).

Figure 39:
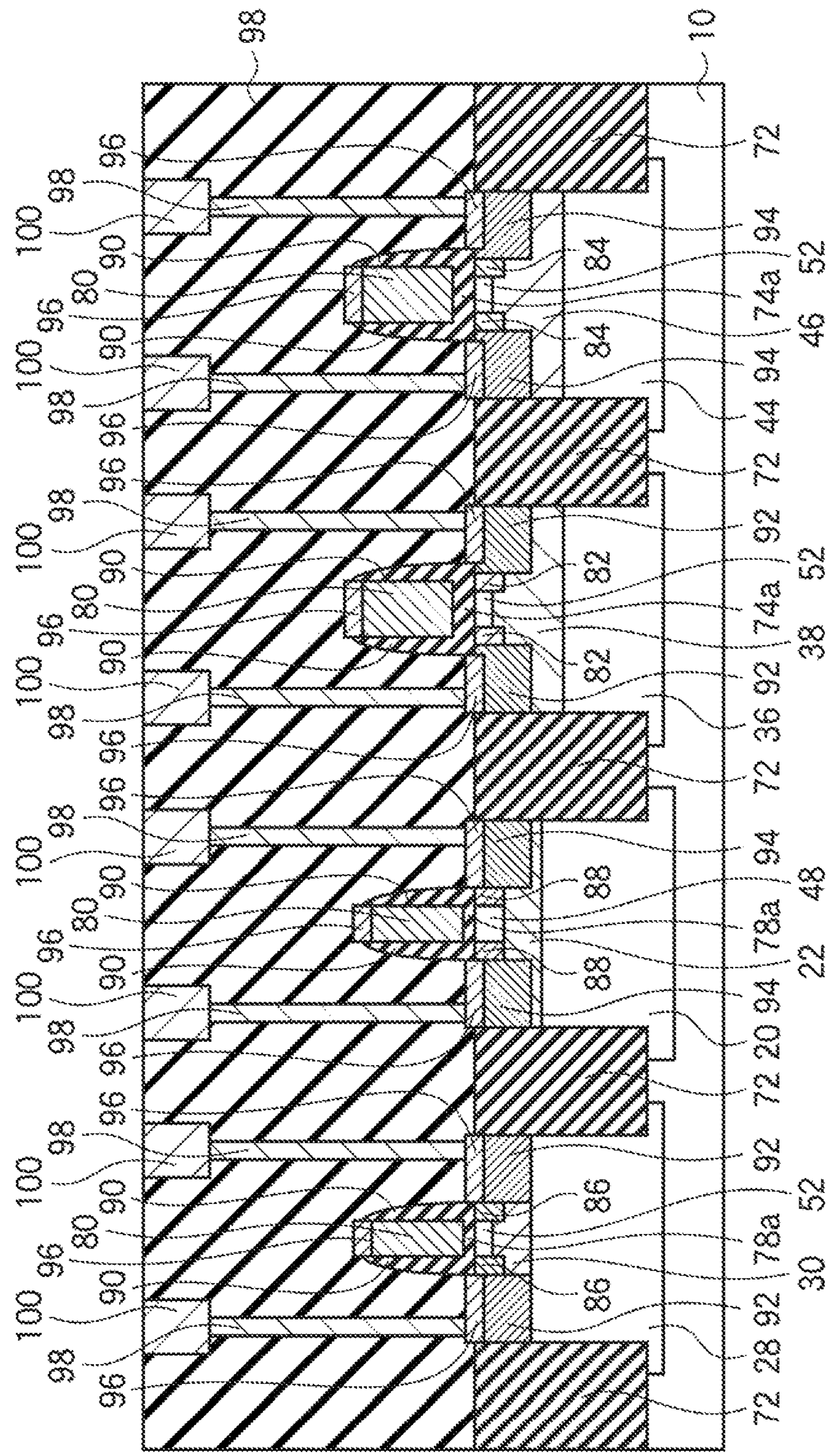

Then, in the same way as in the method of manufacturing the semiconductor device according to the first embodiment illustrated in FIG. 21, the metal silicide film 96, the inter-layer insulating film 98, the contact plugs 100, the interconnections 102, etc. are formed, and the semiconductor device according to the present embodiment is completed (FIG. 39).

As described above, according to the present embodiment, in consideration of different diffusion velocities between an n-type impurity and a p-type impurity, the film thickness of the epitaxial silicon layer is varied between the low voltage PMOS transistor forming region and the low voltage NMOS transistor forming region. Thus, both in the NMOS transistor and the PMOS transistor, the epitaxial silicon layer can have optimum film thickness to obtain target threshold voltages, and the control of the threshold voltages can be improved. Accordingly, the semiconductor device can have higher reliability.

[A Reference Example]

A method of manufacturing a semiconductor device according to a reference example will be described with reference to FIGS. 40A to 46. The same members of the present reference example as those of the semiconductor device and the method of manufacturing the same according to the first to the third embodiments illustrated in FIGS. 1 to 39 are represented by the same reference numbers not to repeat or to simplify the description.

Figure 44A:
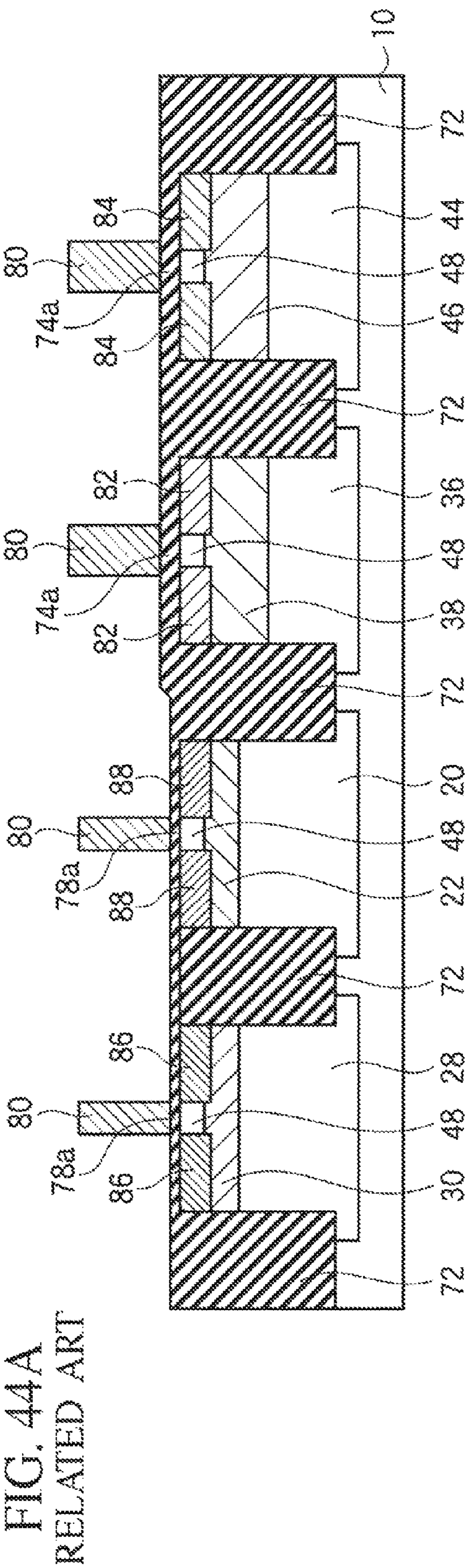
Figure 44B:
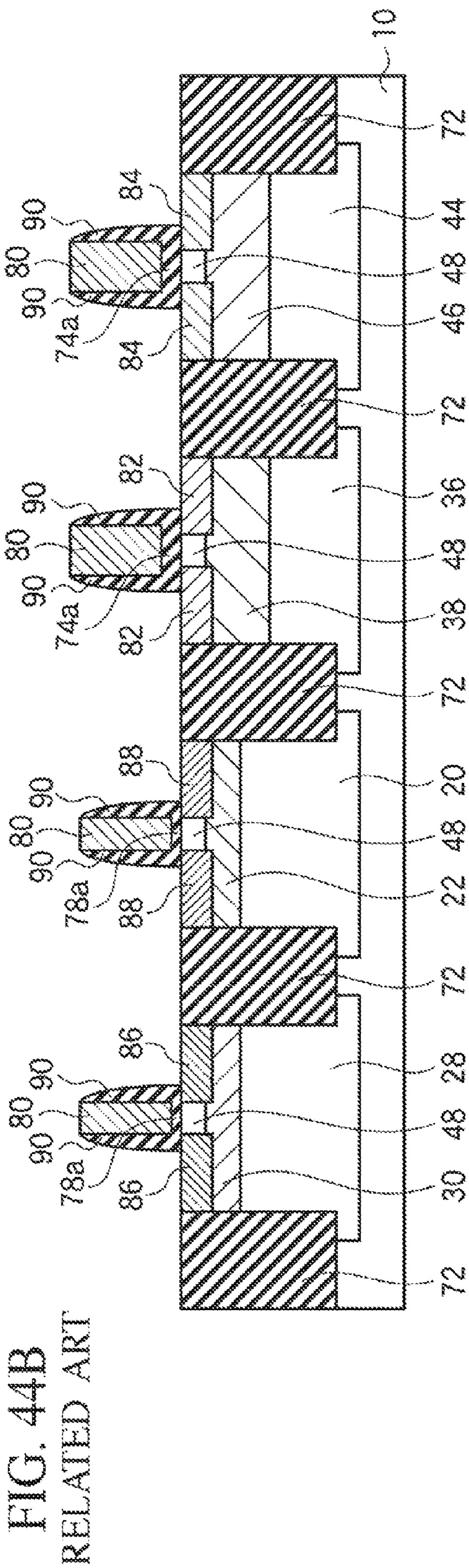
Figure 45:
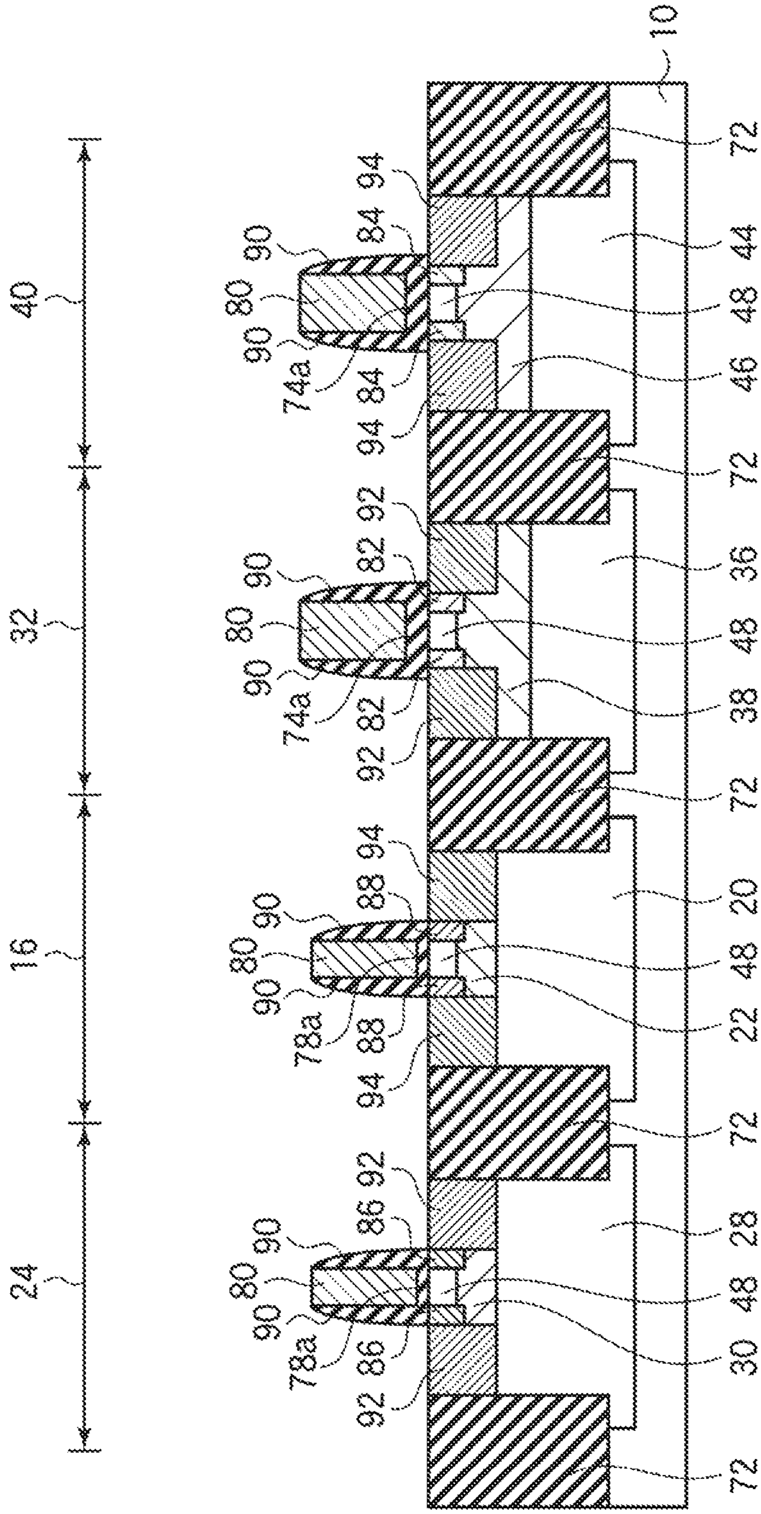
Figure 46:
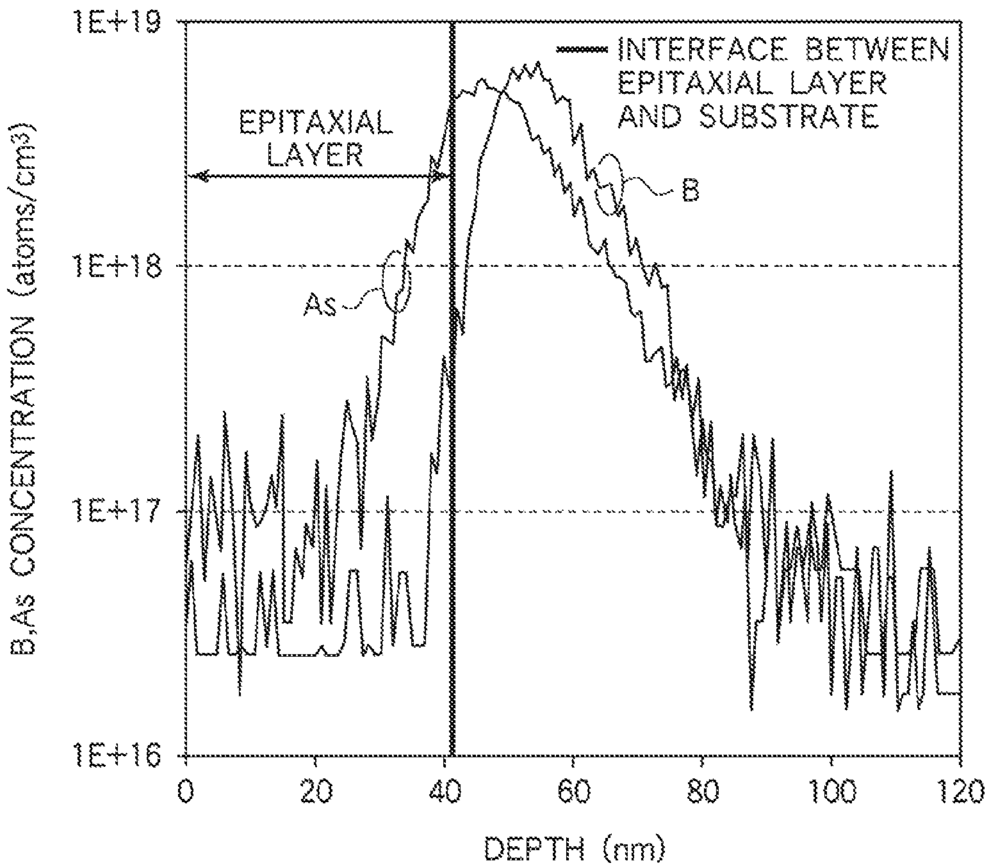
FIG. 46 is a graph illustrating the impurity concentration distributions in the channel of the low voltage transistor manufactured by the method of manufacturing the semiconductor device according to the reference example.

FIGS. 40A-45 are sectional views illustrating a method of manufacturing a semiconductor device according to the present reference example. FIG. 46 is a graph illustrating the impurity concentration distributions in the channel of the low voltage transistor manufactured by the method of manufacturing the semiconductor device according to the present reference example.

First, photolithography and etching, the trench 12 to be used as the mark for the mask alignment is formed in a region other than the product to be formed region of the silicon substrate 10.

Figure 40A:
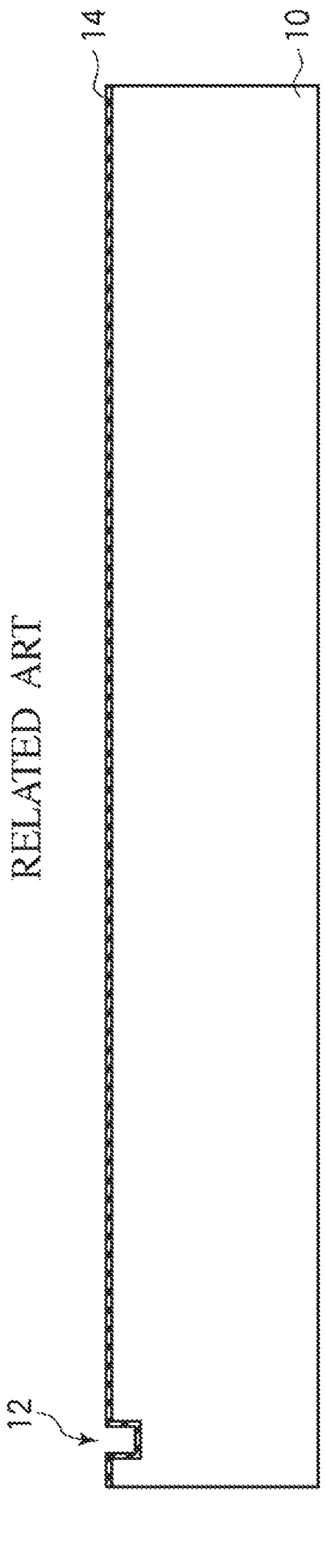
FIGS. 40A-40B, 41A-41B, 42A-42B, 43A-43B, 44A-44B and 45 are sectional views illustrating a method of manufacturing a semiconductor device according to a reference example.

Next, above the entire surface of the silicon substrate 10, the silicon oxide film 14 as the protection film for the surface of the silicon substrate 10 is formed (FIG. 40A).

Then, by photolithography and ion implantation, the n-well 20 and the n-type highly doped impurity layer 22 are formed in the low voltage PMOS transistor forming region 16. For the ion implantation, the same conditions as, e.g., in the first embodiment can be used.

Next, by photolithography and ion implantation, the p-well 28 and the p-type highly doped impurity layer 30 are formed in the low voltage NMOS transistor forming region 24. For the ion implantation, the same conditions as, e.g., in the first embodiment can be used.

Next, by photolithography and ion implantation, the p-well 36 and the p-type impurity layer 38 are formed in the high voltage NMOS transistor forming region 32. For the ion implantation, the same conditions as, e.g., in the first embodiment can be used.

Figure 40B:
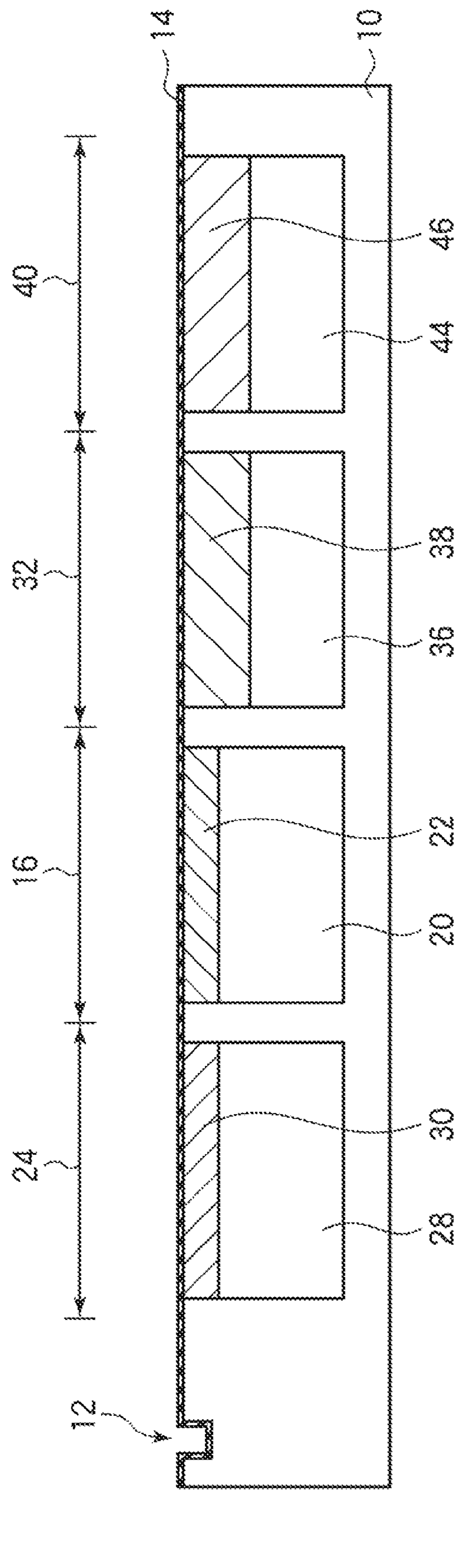

Next, by photolithography and ion implantation, the n-well 44 and the n-type impurity layer 46 are formed in the high voltage PMOS transistor forming region 40. For the ion implantation, the same conditions as, e.g., in the first embodiment can be used (FIG. 40B).

Next, thermal processing is made to recover the ion implantation damage and activate the implanted impurities.

Next, by wet etching with hydrofluoric acid aqueous solution, the silicon oxide film 14 is removed.

Figure 41A:
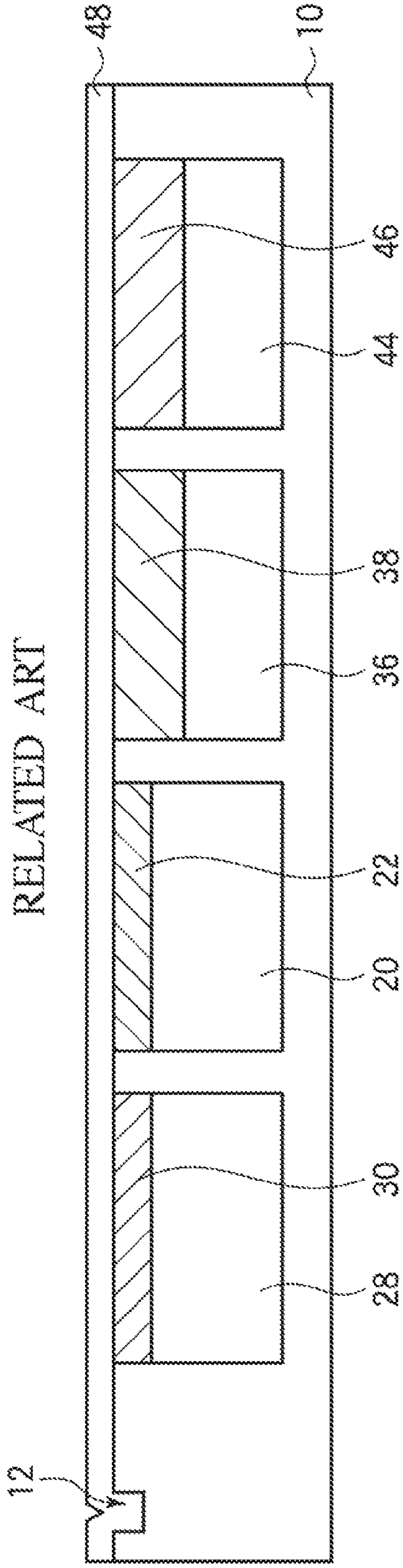

Then, above the silicon substrate 10, the non-doped silicon layer 48 of, e.g., 30 nm-thickness is epitaxially grown (FIG. 41A).

Figure 41B:
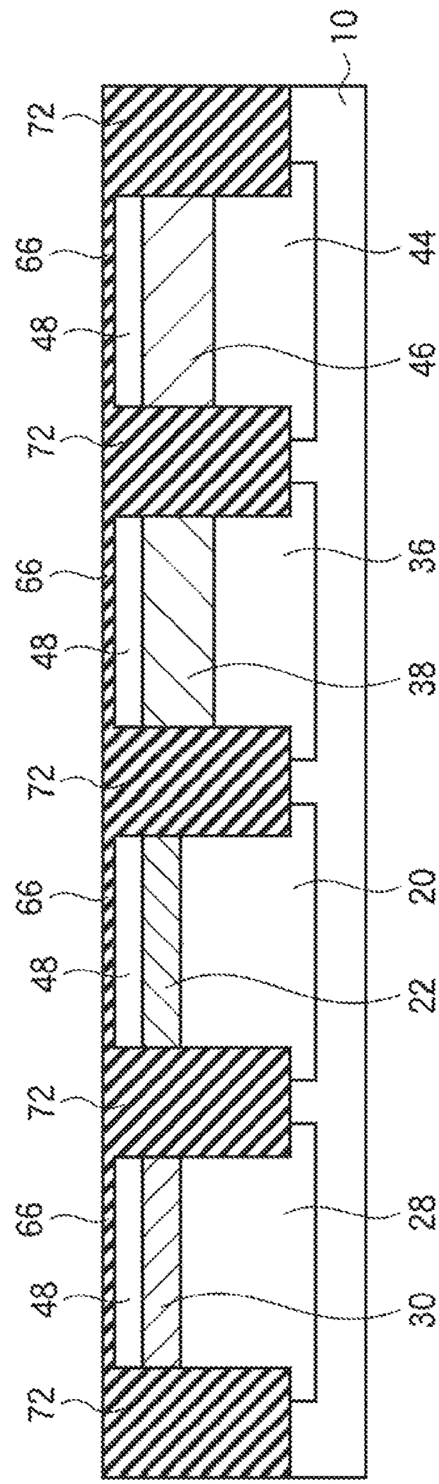

Next, by STI method, the device isolation insulating film 74 is formed in the silicon substrate 10 and the silicon layer 48 (FIG. 41B).

Next, by wet etching with hydrofluoric acid aqueous solution, the silicon oxide film 66 is removed.

Figure 42A:
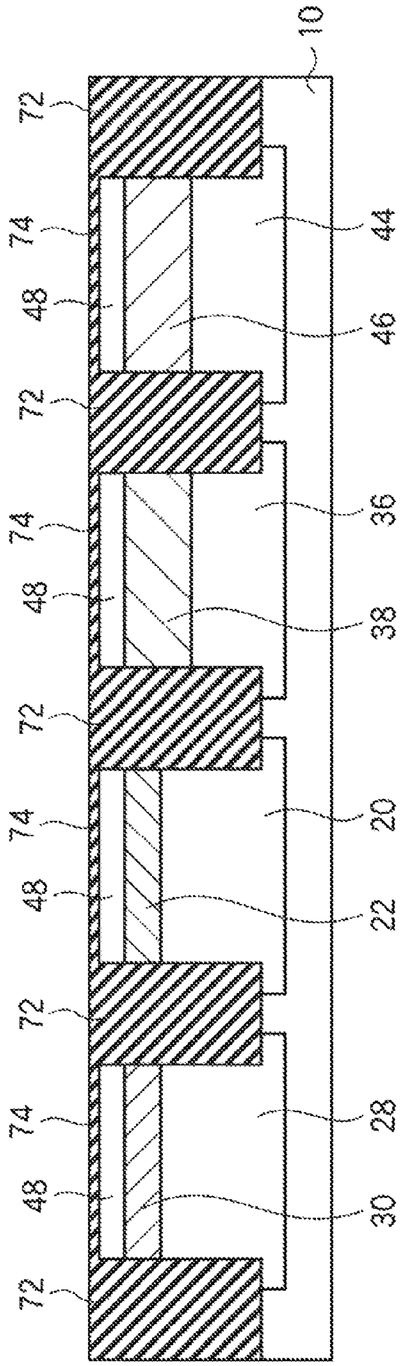

Next, above the active regions, the silicon oxide film 74 to be the gate insulating films 74*a* of the high voltage NMOS transistor and the high voltage PMOS transistors is formed (FIG. 42A).

Figure 42B:
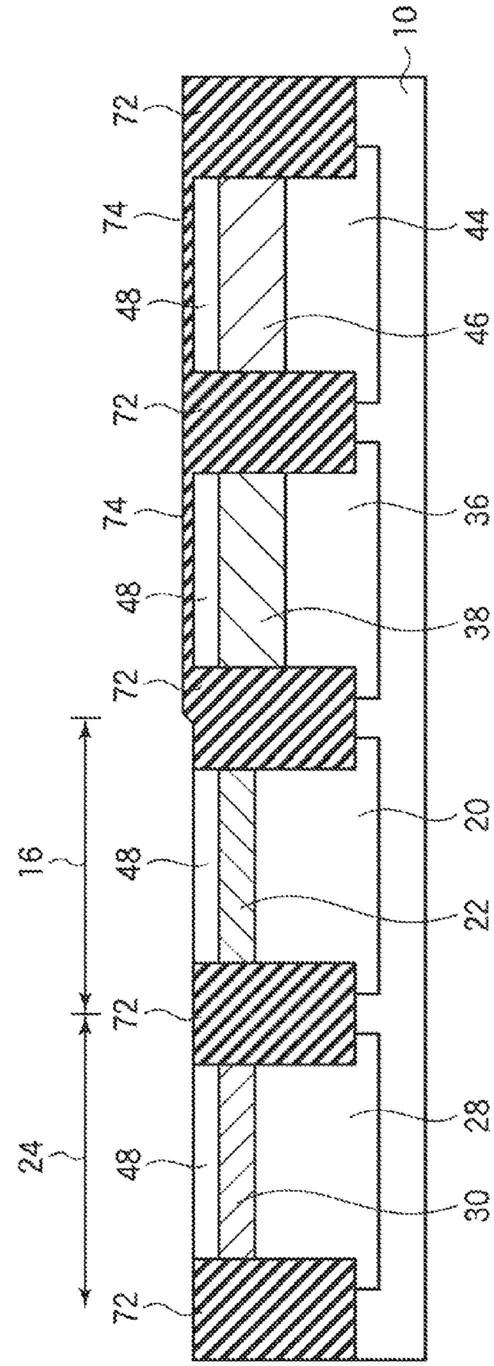

Then, by photolithography and wet etching, the silicon oxide film 74 in the low voltage PMOS transistor forming region 16 and the low voltage NMOS transistor forming region 24 is selectively removed (FIG. 42B).

Figure 43A:
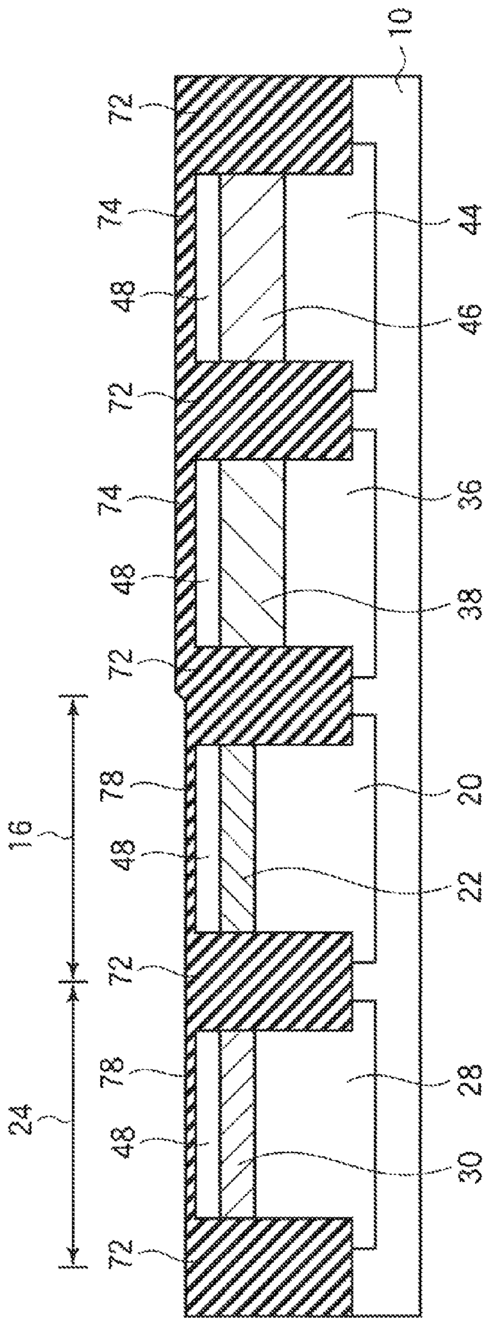

Next, above the active regions of the low voltage PMOS transistor forming region 16 and the low voltage NMOS transistor forming region 24, the silicon oxide film 78 to be the gate insulating films 78*a* is formed (FIG. 43A).

Thus, in the high voltage NMOS transistor forming region 32 and the high voltage PMOS transistor forming region 40, the gate insulating films 74*a* of the silicon oxide film 74 are formed. In the low voltage PMOS transistor forming region 16 and the low voltage NMOS transistor forming region 24, the gate insulating films 78*a* of the silicon oxide film 78 thinner than the silicon oxide film 74 is formed.

Then, above the entire surface, a polycrystalline silicon film of, e.g., 100 nm-thickness is formed by, e.g., LPCVD method.

Figure 43B:
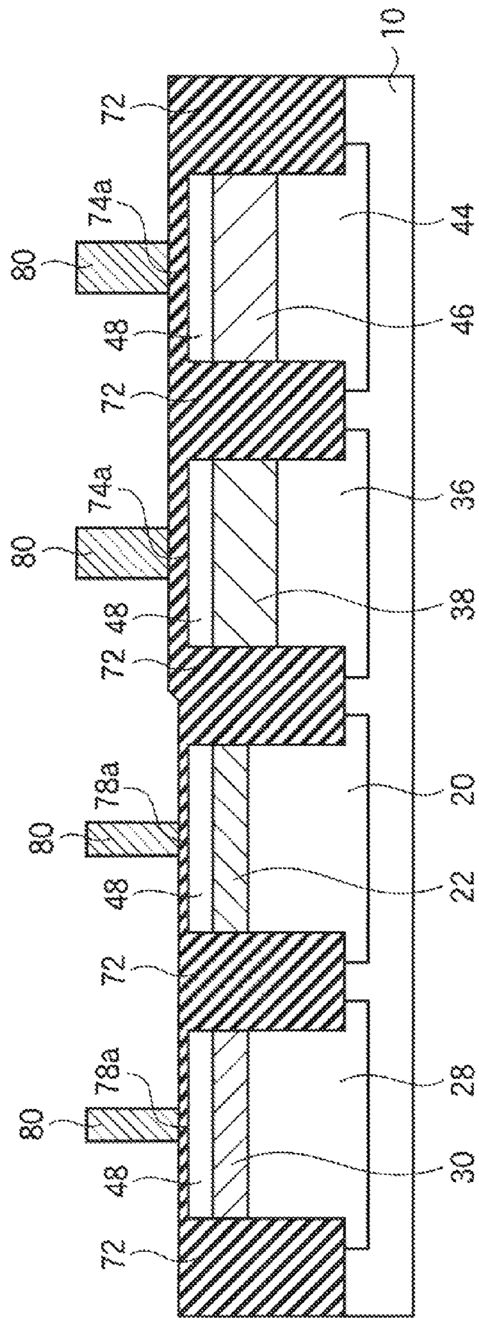

Next, the polycrystalline silicon film is patterned to form the gate electrodes 80 in the respective transistor forming regions (FIG. 43B).

Next, by photolithography and ion implantation, the n-type impurity layers 86 to be the extension regions are formed in the low voltage NMOS transistor forming region. In the low voltage PMOS transistor forming region 16, the p-type impurity layers 88 to be the extension regions are formed. In the high voltage NMOS transistor forming region 32, the n-type impurity layers 82 to be the LDD regions are formed. In the high voltage PMOS transistor forming region 40, the p-type impurity layers 84 to be the LDD regions are formed (FIG. 44A).

Next, a silicon oxide film is deposited and anisotropically etched to form the sidewall spacers 90 on the side walls of the gate electrodes 80 (FIG. 44B).

Next, by photolithography and ion implantation, n-type impurity layers 92 to be the source/drain regions are formed in the low voltage NMOS transistor forming region 24 and the high voltage NMOS transistor forming region 32. In the low voltage PMOS transistor forming region 24 and the high voltage PMOS transistor forming region 40, p-type impurity layers 94 to be the source/drain regions are formed (FIG. 45).

Next, thermal processing is made to activate the implanted impurities.

Thus, above the silicon substrate 10, the low voltage NMOS transistor, the low voltage PMOS transistor, the high voltage NMOS transistor and the high voltage PMOS transistor are formed.

FIG. 46 is a graph illustrating the impurity concentration distributions of the channels of the low voltage transistors formed by the manufacturing method described above.

As illustrated in FIG. 46, the boron (B) forming the p-type highly doped impurity layer 30 forming the low voltage NMOS transistor has the peak of the impurity concentration deeper than the epitaxial silicon layers ("epitaxial layer" in the graph) and less diffuses toward the epitaxial silicon layer.

In contrast to this, the arsenic (As) forming the n-type highly doped impurity layer of the low voltage PMOS transistor has the peak of the impurity concentration near the interface between the epitaxial silicon layer and the silicon substrate, and it is found that the As diffuses toward the epitaxial silicon layer. In comparison with the impurity concentration distribution of boron, arsenic diffused by about 10 nm toward the epitaxial silicon layer.

The threshold voltage of a transistor including the epitaxial silicon layer above the highly doped impurity layer depends on the impurity concentration of the highly doped impurity layer and the film thickness of the non-doped silicon layer (the distance between the gate insulating film and the highly doped impurity layer). Accordingly, when the NMOS transistor and the PMOS transistor have different diffusion velocities of the impurities, the optimum film thicknesses of the silicon layers to obtain target threshold voltages are different. Thus, in the method of manufacturing the semiconductor device according to the present reference example, it is difficult to realize the optimum impurity profile for both the NMOS transistor and the PMOS transistor.

[Modified Embodiments]

The above-described embodiment can cover other various modifications.

For example, in the above-described embodiment, as the base semiconductor substrate, a silicon substrate is used, but the base semiconductor substrate may not be essentially a bulk silicon substrate. Other semiconductor substrates, such as SOI substrate, etc., may be used.

In the above-described embodiment, as the epitaxially semiconductor layer, a silicon layer is used, but the silicon layer is not essential. In place of the silicon layer, other semiconductor layers, such as SiGe layer, SiC layer, etc., may be used.

In the above-described embodiments, the semiconductor device including 4 kinds of transistors, the low voltage NMOS transistor, the low voltage PMOS transistor, the high voltage NMOS transistor and the high voltage PMOS transistor is described. However, the semiconductor device may not include essentially 4 kinds of transistors and may include only 2 kinds of transistors, a low voltage NMOS transistor and a low voltage PMOS transistor, or include plural kinds of low voltage transistors or high voltage transistors of different threshold voltages.

In the above-described embodiments, the wells of the low voltage NMOS transistor and the high voltage NMOS transistor, and the wells of the low voltage PMOS transistor and the high voltage PMOS transistor are separately formed respectively. The wells of the low voltage transistors and the wells of the high voltage transistors may be simultaneously formed.

In the above-described embodiments, the device isolation insulating film is formed after the wells of the respective transistors have been formed. This is for suppressing the film reduction of the device isolation insulating film in the etching steps. The device isolation insulating film may not be formed essentially after the wells have been formed, and the wells may be formed after the device isolation insulating film has been formed.

The structure, the constituent material, the manufacturing conditions, etc. of the semiconductor device described in the embodiment described above are one example and can be changed or modified suitably in accordance with the technical common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:

a first transistor including:
- a first impurity layer of a first conductivity type formed in a first region of a semiconductor substrate;
- a first epitaxial semiconductor layer formed above the first impurity layer;
- a first gate insulating film formed above the first epitaxial semiconductor layer;
- a first gate electrode formed above the first gate insulating film; and
- first source/drain regions of a second conductivity type opposite to the first conductivity type formed in the first epitaxial semiconductor layer and the semiconductor substrate in the first region, the first impurity layer being located between the first source/drain regions; and a second transistor including:
- a second impurity layer of the second conductivity type formed in a second region of the semiconductor substrate;
- a second epitaxial semiconductor layer formed above the second impurity layer and having a film thickness different from a film thickness of the first epitaxial semiconductor layer;
- a second gate insulating film formed above the second epitaxial semiconductor layer;
- a second gate electrode formed above the second gate insulating film; and
- second source/drain regions of the first conductivity type formed in the second epitaxial semiconductor layer and the semiconductor substrate in the second region, the second impurity layer being located between the second source/drain regions, wherein the film thickness of the first epitaxial semiconductor layer is larger than the film thickness of the second epitaxial semiconductor layer, and a diffusion velocity of an impurity which forms the first impurity layer is higher than a diffusion velocity of an impurity which forms the second impurity layer.

2. The semiconductor device according to claim 1, wherein the second impurity layer contains boron and carbon.

3. The semiconductor device according to claim 2, wherein the first impurity layer contains arsenic.

4. The semiconductor device according to claim 1, wherein the first impurity layer contains boron and carbon.

5. The semiconductor device according to claim 4, wherein the second impurity layer contains antimony.

6. The semiconductor device according to claim 1, wherein a height of a surface of the first epitaxial semiconductor layer is equal to a height of a surface of the second epitaxial semiconductor layer.

7. The semiconductor device according to claim 1, further comprising:

a first well formed in the first region of the semiconductor substrate and under the first impurity layer; and a second well formed in the first region of the semiconductor substrate and under the second impurity layer.

8. The semiconductor device according to claim 1, wherein a thickness of the first gate insulating film is equal to a thickness of the second gate insulating film.

9. A semiconductor device comprising:

a first transistor including:

a first impurity layer of a first conductivity type formed in a first region of a semiconductor substrate;

a first epitaxial semiconductor layer formed above the first impurity layer;

a first gate insulating film formed above the first epitaxial semiconductor layer;

a first gate electrode formed above the first gate insulating film; and first source/drain regions of a second conductivity type opposite to the first conductivity type formed in the first epitaxial semiconductor layer and the semiconductor substrate in the first region, the first impurity layer being located between the first source/drain regions;

a second transistor including:

a second impurity layer of the second conductivity type formed in a second region of the semiconductor substrate;

a second epitaxial semiconductor layer formed above the second impurity layer and having a film thickness different from a film thickness of the first epitaxial semiconductor layer;

a second gate insulating film formed above the second epitaxial semiconductor layer;

a second gate electrode formed above the second gate insulating film; and second source/drain regions of the first conductivity type formed in the second epitaxial semiconductor layer and the semiconductor substrate in the second region, the second impurity layer being located between the second source/drain regions; and a third transistor including:

a third impurity layer of the first conductivity type formed in a third region of the semiconductor substrate;

a third epitaxial semiconductor layer formed above the third impurity layer and having a film thickness different from a film thickness of the first epitaxial semiconductor layer;

a third gate insulating film formed above the third epitaxial semiconductor layer and having a film thickness different from the film thicknesses of the first gate insulating film and the second gate insulating film;

a third gate electrode formed above the third gate insulating film; and third source/drain regions of the second conductivity type formed in the third epitaxial semiconductor layer and the semiconductor substrate in the third region; and a fourth transistor including:

a fourth impurity layer of the second conductivity type formed in a fourth region of the semiconductor substrate;

a fourth epitaxial semiconductor layer formed above the fourth impurity layer and having a film thickness different from the film thickness of the first epitaxial semiconductor layer;

a fourth gate insulating film formed above the fourth epitaxial semiconductor layer and having a film thickness different from the film thicknesses of the first gate insulating film and the second gate insulating film;

a fourth gate electrode formed above the fourth gate insulating film; and fourth source/drain regions of the first conductivity type formed in the fourth epitaxial semiconductor layer and the semiconductor substrate in the fourth region.

10. The semiconductor device according to claim 9, wherein the film thickness of the first epitaxial semiconductor layer is larger than the film thickness of the second epitaxial semiconductor layer, and a diffusion velocity of an impurity forming the first impurity layer is higher than a diffusion velocity of an impurity forming the second impurity layer.

11. The semiconductor device according to claim 9, wherein the second impurity layer contains boron and carbon.

12. The semiconductor device according to claim 11, wherein the first impurity layer contains arsenic.

13. The semiconductor device according to claim 9, wherein the first impurity layer contains boron and carbon.

14. The semiconductor device according to claim 13, wherein the second impurity layer contains antimony.

15. The semiconductor device according to claim 9, wherein a height of a surface of the first epitaxial semiconductor layer is equal to a height of a surface of the second epitaxial semiconductor layer.

* * * * *